United States Patent
Hong et al.

(10) Patent No.: US 10,720,378 B2
(45) Date of Patent: Jul. 21, 2020

(54) COMPONENT STRUCTURE, POWER MODULE AND POWER MODULE ASSEMBLY STRUCTURE

(71) Applicant: Delta Electronics (Shanghai) CO., LTD, Shanghai (CN)

(72) Inventors: Shouyu Hong, Shanghai (CN); Juan Cheng, Shanghai (CN); Tao Wang, Shanghai (CN); Zhenqing Zhao, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 16/003,234

(22) Filed: Jun. 8, 2018

(65) Prior Publication Data

US 2019/0067167 A1 Feb. 28, 2019

(30) Foreign Application Priority Data

Aug. 31, 2017 (CN) .......................... 2017 1 0772709
Jan. 5, 2018 (CN) .......................... 2018 1 0010312

(51) Int. Cl.
*H01L 23/492* (2006.01)
*H01L 25/07* (2006.01)
(Continued)

(52) U.S. Cl.
CPC ........ *H01L 23/4922* (2013.01); *H01L 25/072* (2013.01); *H01L 25/16* (2013.01);
(Continued)

(58) Field of Classification Search
CPC ... H01L 23/4922; H01L 25/072; H01L 25/16; H01L 25/18; H02B 1/205; H02M 7/003; H02G 5/005
See application file for complete search history.

(56) References Cited

U.S. PATENT DOCUMENTS 9,270,102 B2 * 2/2016 Kikuchi ................. B60L 53/14
2009/0085219 A1 4/2009 Bayerer
(Continued)

FOREIGN PATENT DOCUMENTS

CN 201616760 U 10/2010
CN 104157634 A 11/2014
(Continued)

OTHER PUBLICATIONS

The EESR dated Jan. 22, 2019 by the EP office.
The CN1OA issued on Jul. 26, 2019 by the CNIPA.

*Primary Examiner* — James Wu
*Assistant Examiner* — Hung Q Dang
(74) *Attorney, Agent, or Firm* — Yunling Ren

(57) ABSTRACT

The present disclosure relates to a component structure, a power module and a power module assembly structure having the component structure. The component structure comprises: a first bus bar, having one end extending to a first plane to form a first connecting terminal; a second bus bar, comprising a front portion of the second bus bar and a rear portion of the second bus bar, wherein the front portion of the second bus bar is laminated in parallel with the first bus bar, and the rear portion of the second bus bar is extended to a second plane to form a second connecting terminal; and an external circuit comprising a third bus bar, wherein the third bus bar is settled in parallel with the rear portion of the second bus bar, to reduce a parasitic inductance between the first connecting terminal and the second connecting terminal.

9 Claims, 18 Drawing Sheets

(51) Int. Cl.
*H02B 1/20* (2006.01)
*H02M 7/00* (2006.01)
*H01L 25/16* (2006.01)
*H01L 25/18* (2006.01)
*H02G 5/00* (2006.01)

(52) U.S. Cl.
CPC ............ *H01L 25/18* (2013.01); *H02B 1/205* (2013.01); *H02M 7/003* (2013.01); *H02G 5/005* (2013.01)

(56) References Cited

U.S. PATENT DOCUMENTS

| | | | |
|---|---|---|---|
| 2011/0304948 A1* | 12/2011 | Lee | H01G 9/155 361/301.1 |
| 2017/0063066 A1* | 3/2017 | Doo | H02M 7/003 |
| 2018/0287316 A1* | 10/2018 | Robert | H01M 2/202 |

FOREIGN PATENT DOCUMENTS

| | | |
|---|---|---|
| CN | 105322484 A | 2/2016 |
| CN | 105514069 A | 4/2016 |
| CN | 107046372 A | 8/2017 |
| EP | 1172908 A2 | 1/2002 |
| EP | 3203625 A1 | 8/2017 |
| JP | 2004055832 A | 2/2004 |
| JP | 2016067171 A | 4/2016 |
| WO | 2015162712 A1 | 10/2015 |

* cited by examiner

COMPONENT STRUCTURE, POWER MODULE AND POWER MODULE ASSEMBLY STRUCTURE

CROSS REFERENCE

The present application claims the priority of Chinese Patent Application No. 201710772709.7, filed on Aug. 31, 2017, and Chinese Patent Application No. 201810010312.9, filed on Jan. 5, 2018, and the entire contents thereof are incorporated herein by reference as part of the present application.

TECHNICAL FIELD

The present disclosure relates to the field of power electronics technology, and in particular, to a component structure for connecting a power module and an external circuit, a power module and a power module assembly structure having the component structure.

BACKGROUND

Modern power electronic devices, as an important part of power conversions, are widely used in the electric power, electronics, motor drivers, and energy industries. It is always an important pursuing goal for those skilled in the art to ensure long-term stable operation of the power electronic devices and improve the power conversion efficiency of the power electronic devices.

It should be noted that, information disclosed in the above background portion is provided only for better understanding of the background of the present disclosure, and thus it may contain information that does not form the prior art known by those ordinary skilled in the art.

SUMMARY

According to one aspect of the present disclosure, there is provided a component structure, for connecting a power module and an external circuit, wherein the component structure includes:

a first bus bar, having one end extending to a first plane to form a first connecting terminal;

a second bus bar, including a front portion of the second bus bar and a rear portion of the second bus bar, wherein the front portion of the second bus bar is laminated in parallel with the first bus bar, and the rear portion of the second bus bar is extended to a second plane to form a second connecting terminal; and the external circuit including a third bus bar, wherein the third bus bar is settled in parallel with the rear portion of the second bus bar, to reduce a parasitic inductance between the first connecting terminal and the second connecting terminal.

According to an aspect of the present disclosure, there is provided a power module, wherein the power module includes:

a substrate;

a power unit, disposed on the substrate; and any one of the component structures described above, the component structure connecting the power unit and an external circuit.

According to an aspect of the present disclosure, there is provided a power module assembly structure, wherein the power module assembly structure includes:

a substrate;

two power elements connected in series, disposed on the substrate; and a first conductive strip and a second conductive strip, coupled to the two power elements respectively, wherein the first conductive strip and the second conductive strip extend from the substrate to a first side of the power module assembly structure in parallel and two connecting terminals are formed on the first side; an extending portion exists between the two connecting terminals, and the extending portion overlaps with an external conductive strip to reduce a parasitic inductance between the two connecting terminals.

It is to be understood that both the foregoing general description and the following detailed description are exemplary and explanatory only and are not restrictive of the present disclosure.

BRIEF DESCRIPTION OF THE DRAWINGS

The accompanying drawings herein are incorporated in and constitute a part of this specification, illustrate embodiments consistent with the present disclosure, and together with the description serve to explain the principles of the present disclosure. Obviously, the drawings in the following description are merely some embodiments of the present disclosure, and those skilled in the art can also obtain other drawings based on these drawings without any creative work.

DETAILED DESCRIPTION

Figure 1:
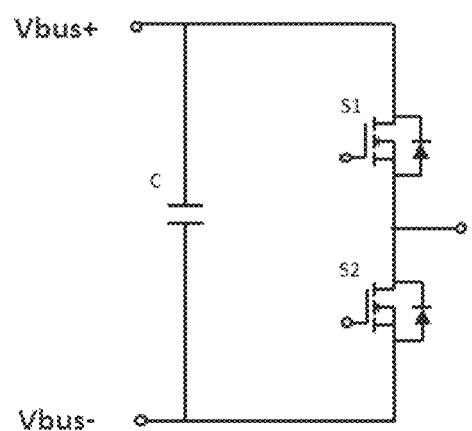
FIG. 1 is a schematic diagram of a half-bridge power circuit with capacitor clamping.

Example embodiments will now be described more fully with reference to the accompanying drawings. However, example embodiments can be implemented in various forms and should not be construed as limited to the examples set forth herein; rather, these embodiments are provided so that the present disclosure will be more comprehensive and complete, and will fully convey the concept of the example embodiments to those skilled in the art. The features, structures, or characteristics described may be combined in any suitable manner in one or more embodiments.

In addition, the drawings are merely schematic illustrations of the present disclosure and are not necessarily drawn to scale. The same reference numerals in the drawings denote the same or similar parts, and thus their repeated description will be omitted.

Power semiconductor elements are core parts of modern power electronic devices, performance of which directly determines the reliability and power conversion efficiency of the power electronic devices. In order to design a more reliable and safer power electronic device with higher performance, it is desirable that the power semiconductor element has characteristics of low voltage stress and low power loss. Power semiconductor elements used in the power electronic devices operate in a switching state, and high-frequency switching actions will cause a high current change rate di/dt in the circuit. According to the principle of the circuit, a voltage Vs will be generated when a changing current acts on a parasitic inductor $L_{stray}$, the calculation formula is as follows:

$$V_s = L_{stray} di/dt$$

It can be seen that reducing the parasitic inductance may reduce the generated voltage spike when the current change rate is constant. On the other hand, the parasitic inductance is related to the packaging and connection of the power semiconductor element.

Therefore, in order to reduce the voltage stress across the power semiconductor device, a circuit for controlling the voltage spike is generally placed outside the power semiconductor device and near the connection terminals. As shown in FIG. 1, it is a schematic diagram of a power semiconductor circuit with a capacitor clamping circuit. The capacitor C is usually provided on an external circuit connected to the power module nearby, such as a laminated bus bar, a PCB system board, a control board, and the like. Since the circuits in the periphery of the power module are usually quite easy to set wiring layers with superimposing upper and lower layers, the loop inductance of the periphery circuit may be controlled at a quite low level, which results in that the entire loop inductance is dominated inside the power module. That is, this method may reduce the voltage spike caused by the parasitic inductance outside the power module, but cannot reduce the voltage spike caused by the parasitic inductance inside the power module.

Figure 2:
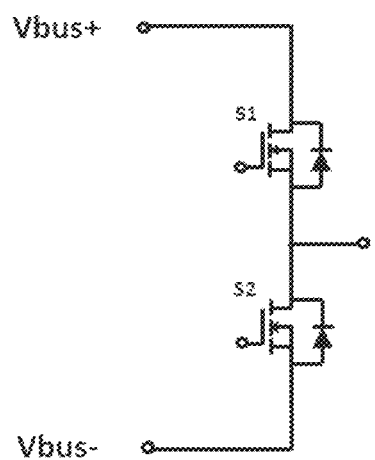
FIG. 2 is a schematic diagram of a half-bridge circuit.
Figure 3:
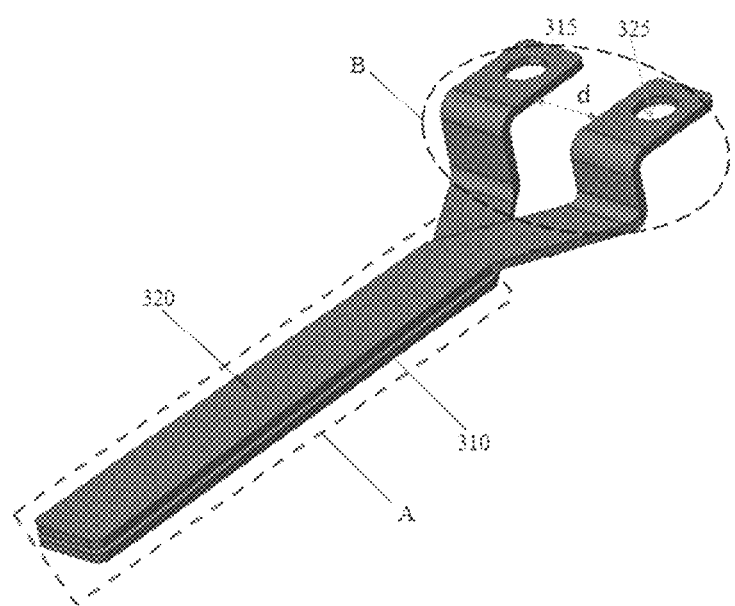
FIG. 3 is a schematic structural view of a laminated bus bar used in the half-bridge circuit as shown in FIG. 2.

In order to reduce the parasitic inductance inside the power module, a laminated bus bar structure is used inside the power module. Taking an MOSFET half-bridge circuit as an example, FIG. 2 is a schematic diagram of the half-bridge circuit. FIG. 3 is a schematic structural view of a laminated bus bar used in the half-bridge circuit of FIG. 2. As shown in FIG. 3, upper and lower layers of bus bars 310 and 320, in the dashed box A, the currents of which are with opposite directions superimpose with each other, and the loop inductance inside the power module may be reduced well. However, in the dashed box B, the two bus bars 310 and 320 are separated to fan-out terminals 315 and 325 respectively. Due to factors such as voltage isolation, a distanced of the fan-out portions between the terminals 315 and 325 is relatively far, and the loop inductance between the two fan-out portions is large. That is, the solution in FIG. 3 does not reduce the parasitic inductance inside the power module to an ideal value.

Accordingly, in order to reduce the loop inductance, a laminated bus bar has been adopted inside the power module to lead out electrodes. However, due to the separation of the fan-out portions of the bus bar, it is still unable to reduce the parasitic inductance to the optimal value. Currently, the parasitic inductance of the external circuit connected to the power module has been controlled to the minimum. It seems to have reached a bottleneck stage to achieve an even lower parasitic inductance by improving the power module and the external circuit respectively. In order to solve the above bottleneck problem, the present disclosure proposes a novel component structure which may conveniently and effectively reduce the loop inductance.

The present disclosure provides a component structure, for connecting a power module and an external circuit. The component structure includes a first bus bar and a second bus bar. The first bus bar has one end extending to a first plane and a first connecting terminal is formed. The second bus bar includes a front portion of the second bus bar and a rear portion of the second bus bar. The front portion of the second bus bar is laminated in parallel with the first bus bar, and the rear portion of the second bus bar extends to a second plane and a second connecting terminal is formed. The external circuit includes a third bus bar. The third bus bar is settled in parallel with the rear portion of the second bus bar, to reduce a parasitic inductance between the first connecting terminal and the second connecting terminal.

As for a component structure of the present disclosure, within the power module, the first bus bar and the front portion of the second bus bar are laminated in parallel to form a laminated bus bar, which reduces the parasitic inductance inside the power module. At the fan-out terminals of the modules, the rear portion of the second bus bar and the third bus bar of the external circuit are settled in parallel to form a stacked bus bar structure, which reduces the parasitic inductance between the fan-out terminals of the power module. Through the design of the laminated bus bars inside the power module and the cooperation of the fan-out terminals inside the power module and the external circuit, the parasitic inductance of the power module is greatly reduced, thereby facilitating and effectively reducing the voltage stress and power loss of the power electronic semiconductor device, and then improving the reliability and safety of the power electronic devices.

In order to ensure a good parasitic inductance reduction effect, in an exemplary embodiment of the present disclosure, a portion of the third bus bar settled in parallel with the rear portion of the second bus bar is defined as a front portion of the third bus bar. Surfaces of the rear portion of the second bus bar and the front portion of the third bus bar disposed oppositely are a first surface and a second surface respectively. An area ratio of an overlapping area of the rear portion of the second bus bar and the front portion of the third bus bar to the first surface is greater than 0.5, and an area ratio of an overlapping area of the rear portion of the second bus bar and the front portion of the third bus bar to the second surface is greater than 0.5. The inventors have found that when the area ratio of the overlapping area to the first surface and the area ratio of the overlapping area to the second surface are both greater than 0.5, the parasitic inductance can be effectively reduced. In this embodiment, the area ratio of the overlapping area to the first surface and the area ratio of the overlapping area to the second surface may be different.

In order to further ensure a good parasitic inductance reduction effect, in another exemplary embodiment of the present disclosure, the area ratios of the overlapping area of the rear portion of the second bus bar and the front portion of the third bus bar to the first surface and the second surface are both 1.

In the following, various parts of the component structure of the present disclosure will be described in more detail with reference to FIGS. 4 to 13.

Figure 4:
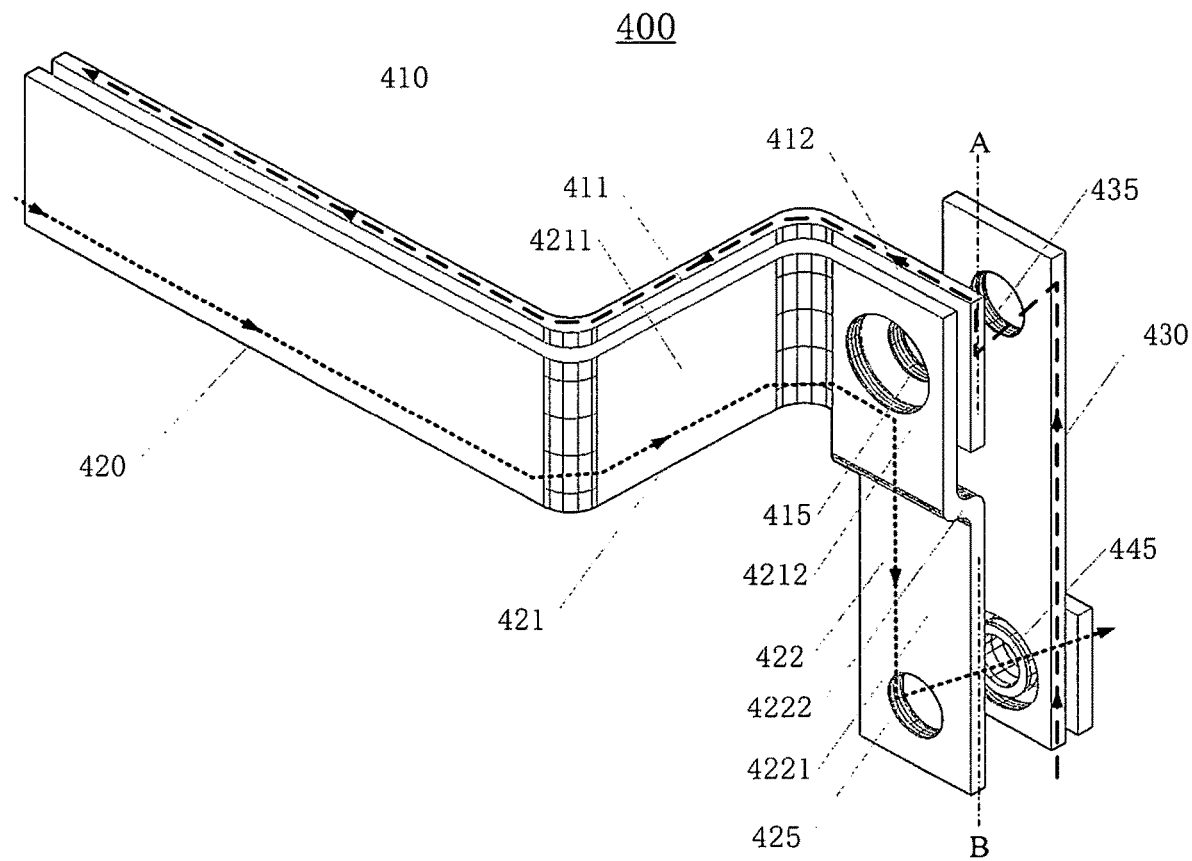
FIG. 4 is a schematic diagram of a component structure in an exemplary embodiment of the present disclosure.

FIG. 4 is a schematic diagram of a component structure in an exemplary embodiment of the present disclosure. The component structure 400 is used for connecting the power module and the external circuit. The component structure 400 includes a first bus bar 410 and a second bus bar 420. In the embodiment, the power module may be a power semiconductor element, such as an MOS transistor, an IGBT (Insulated Gate Bipolar Transistor), a transistor. Or the power module may be a conversion circuit composed of these power semiconductor elements, for example, the half-bridge power circuit in FIG. 2. The external circuit may be an external circuit distribution unit corresponding to the power distribution of the power module, but it is not limited thereto.

Continuing to refer to FIG. 4, one end of the first bus bar 410 extends to a first plane A and a first connecting terminal 415 is formed. The second bus bar 420 includes a front portion of the second bus bar 421 and a rear portion of the second bus bar 422. The front portion of the second bus bar 421 and the rear portion of the second bus bar 422 are connected. The front portion of the second bus bar 421 is laminated in parallel with the first bus bar 410, and the rear portion of the second bus bar extends to a second plane B and a second connecting terminal 425 is formed. The first connecting terminal 415 and the second connecting terminal 425 are served as connecting ports between the power module and the external circuit. The external circuit includes a third bus bar 430. The third bus bar 430 is settled in parallel with the rear portion of the second bus bar 422, to reduce a parasitic inductance between the first connecting terminal 415 and the second connecting terminal 425. It should be noted that only the partial structure of the third bus bar is shown in the figure, and the third bus bar may have a larger area and length to connect other elements of the external circuit. Since the subsequent structures are weakly related to the present disclosure, they are not shown in detail.

A portion of the third bus bar 430 disposed opposite to the rear portion of the second bus bar 422 is further defined as a front portion of the third bus bar. Surfaces of the rear portion of the second bus bar 422 and the front portion of the third bus bar disposed oppositely are a first surface and a second surface respectively. An area ratio of an overlapping area of the rear portion of the second bus bar and the front portion of the third bus bar to the first surface is greater than 0.5, and an area ratio of an overlapping area of the rear portion of the second bus bar and the front portion of the third bus bar to the second surface is greater than 0.5. In this embodiment, the area ratio of the overlapping area to the first surface and the area ratio of the overlapping area to the second surface may be different. In order to further ensure a good parasitic inductance reduction effect, the area ratios of the overlapping area of the rear portion of the second bus bar and the front portion of the third bus bar to the first surface and the second surface may both be 1, which may further effectively reduce the parasitic inductance. That is, the rear portion of the second bus bar 422 and the front portion of the third bus bar are overlapped in parallel, and surface areas of the oppositely disposed surfaces are equal.

As shown in FIG. 4, in the present exemplary embodiment, one end of the third bus bar 430 is provided with a third connecting terminal 435, and the third connecting terminal 435 is stacked and connected with the first connecting terminal 415. For example, the third connecting terminal 435 and the first connecting terminal 415 can be electrically connected by mechanical fixing or the like. The external circuit is further provided a fourth connecting terminal 445, and the fourth connecting terminal 445 and the second connecting terminal 425 are stacked and connected. For example, the fourth connecting terminal 445 and the second connecting terminal 425 may be electrically connected by mechanical fixing or the like. It should be noted that, another wiring layer connected with the fourth terminal 445 is arranged in parallel with the third bus bar, and may have a larger area and length to connect other elements of the external circuit. Since the subsequent structures are weakly related to the present disclosure, they are not shown in detail.

A schematic diagram of a flow direction of the current in each part of the component structure 400 is further shown in FIG. 4. The flow direction of the current is indicated by the dashed arrow in FIG. 4. It is assumed that the current flows from the first bus 410 into the power module and flows out from the second bus bar 420. As shown in FIG. 4, the current of the external circuit flows to the third connecting terminal 435 via the third bus bar 430. The first connecting terminal 415 is connected with the third connecting terminal 435, and the current flows into the first bus bar 410 through the first connecting terminal 415. Then through a circuit distribution design inside the power module, the conversion of the current from the first bus bar 410 to the second bus bar 420 is achieved, and the current flows out from the second bus bar 420. The current flows into the fourth connecting terminal 445 through the second connecting terminal 425 and then flows into the external circuit. The wiring layer of the external circuit is not shown in detail, and it may usually be implemented by a laminated bus bar, a PCB or a laminated copper bar, but not limited thereto. It should be noted that areas of bus bars of upper and lower layers in FIG. 4 remain strictly identical, but in fact, because some electrodes need to be connected to a certain layer of the laminated bus bars, certain avoidance space may need to be left, resulting in that areas of bus bars of upper and lower layers do not have to be strictly consistent. Those skilled in the are can determine it flexibly according to needs, and no special explanation will be given herein.

In the present exemplary embodiment, the first bus bar 410 and the front portion of the second bus bar 421 are superimposed, and the interlayer distance is relatively small. Due to limitations of voltage isolation and material or the like, the thickness of the bus bar is generally between 20 μm and 500 μm. Because the direction of the current inside the first bus bar 410 is opposite to that of the current inside the front portion of the second bus bar 421, the loop inductance of this portion is relatively low, which may be usually limited to between 0~9 nH. Due to considerations of voltage isolation or the like, a distance of the rear portion of the second bus bar 422 is relatively long (usually greater than 5 mm), resulting in a large parasitic inductance, which is usually larger than 10 nH. Thus the rear portion of the second bus bar 422 becomes a major factor affecting the loop inductance. However, in the present exemplary embodiment, since the third bus bar 430 of the external circuit and the rear portion of the second bus bar 422 are superimposed in parallel or overlapped in parallel with a large overlapping area, and the current direction of the third bus bar 430 is opposite to that of the rear portion of the second bus bar 422, the loop inductance can be partially or completely counteracted, so that its parasitic inductance is greatly reduced. The overall circuit parasitic inductance of the component structure 400 is greatly reduced. Therefore, the present disclosure effectively solves the problem of large circuit inductance through the design of a laminated bus bar inside the power module and the cooperation with the bus bar of the external circuit.

From the above, in the present disclosure, a current conducting direction of the first bus bar 410 is opposite to that of the front portion of the second bus bar 421, and a current conducting direction of the rear portion of the second bus bar 422 is opposite to that of the third bus bar 450. Since conducting directions of the current are opposite and the counteracting effect of the opposite currents is significant, the parasitic inductance can be greatly reduced.

Continuing to refer to FIG. 4, the first bus bar 410 further includes a first extending portion 411 and a first bending portion 412. The first bending portion 412 is located in the first plane A. The first connecting terminal 415 is disposed at an end of the first bending portion 412. The front portion of the second bus bar 421 further includes a second extending portion 4211 and a second bending portion 4212. The first extending portion 411 and the second extending portion 4211 are laminated in parallel, and the first bending portion 412 and the second bending portion 4212 are laminated in parallel. The rear portion of the second bus bar further includes a third extending portion 4221 and a third bending portion 4222. The third bending portion 4222 is connected to the second bending portion 4212, and the third extending portion 4221 is located in the second plane B. The second connecting terminal 425 is disposed at an end of the third extending portion 4221. In this embodiment, by providing the third bending portion 4222, the first plane A and the second plane B can be in the same plane, and the interlayer distance between the third bus bar 430 and the rear portion of the second bus bar 422 can be minimized, which may further reduce the parasitic inductance.

Figure 5:
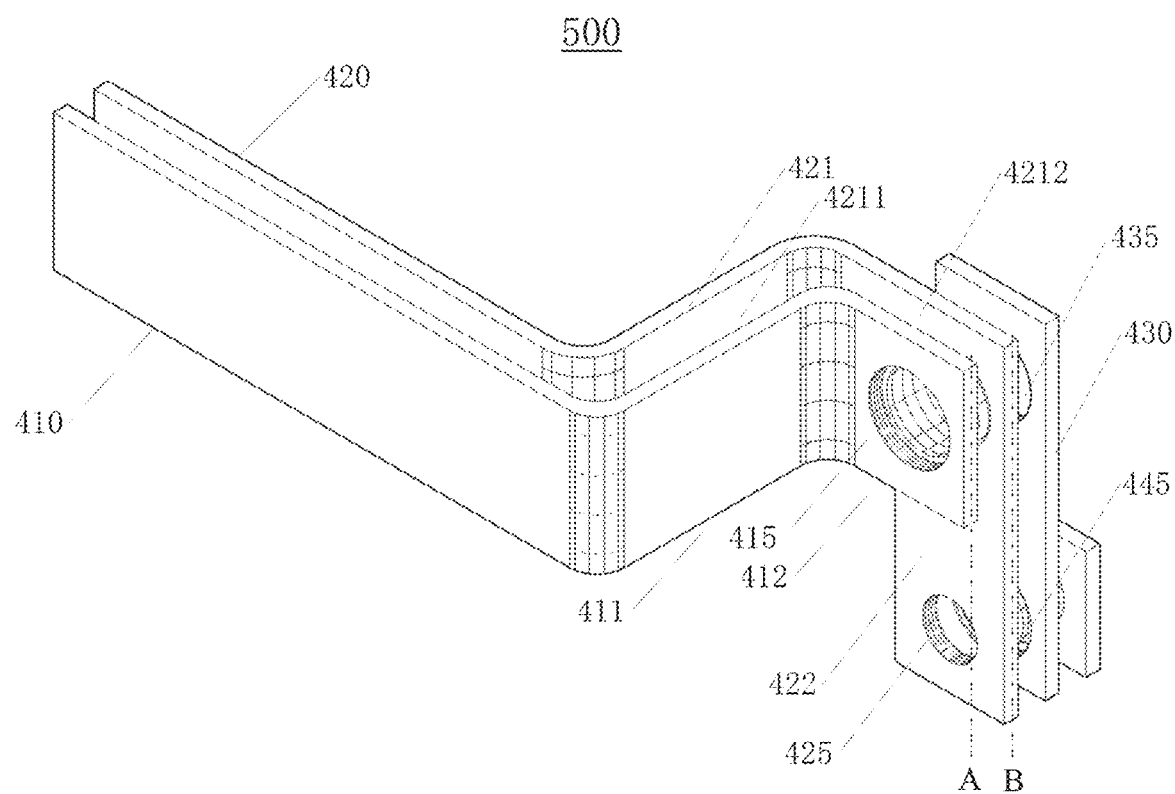
FIG. 5 is a schematic diagram of a component structure in an exemplary embodiment of the present disclosure.

In the component structure 500 of one exemplary embodiment of the present disclosure, as shown in FIG. 5, it may also be the case that the front portion of the second bus bar 421 includes a second extending portion 4211 and a second bending portion 4212, the rear portion of the second bus bar 422 is connected with the second bending portion 4212, and the second bending portion 4212 and the rear portion of the second bus bar 422 are both located in the second plane B. That is, the rear portion of the second bus bar 422 does not include the third bending portion described above. The rear portion of the second bus bar 422 and the second bending portion 4212 constitute a flat plate structure. In addition, in FIG. 5, the third bus bar 430 is adjacent to and disposed under the rear portion of the second bus bar 422. And the third bus bar 430 is connected to the first bus bar 410 through a via hole. In this way, it may also reduce the interlayer distance between the third bus bar 430 and the rear portion of the second bus bar 422, and further reduce the parasitic inductance.

It should be noted that only main structures of the component structure are described in FIG. 4 and FIG. 5, in which the insulating layer is not shown, and the thickness, width and the like of the bus bar are also schematically depicted instead of being drawn in scale.

Figure 6:
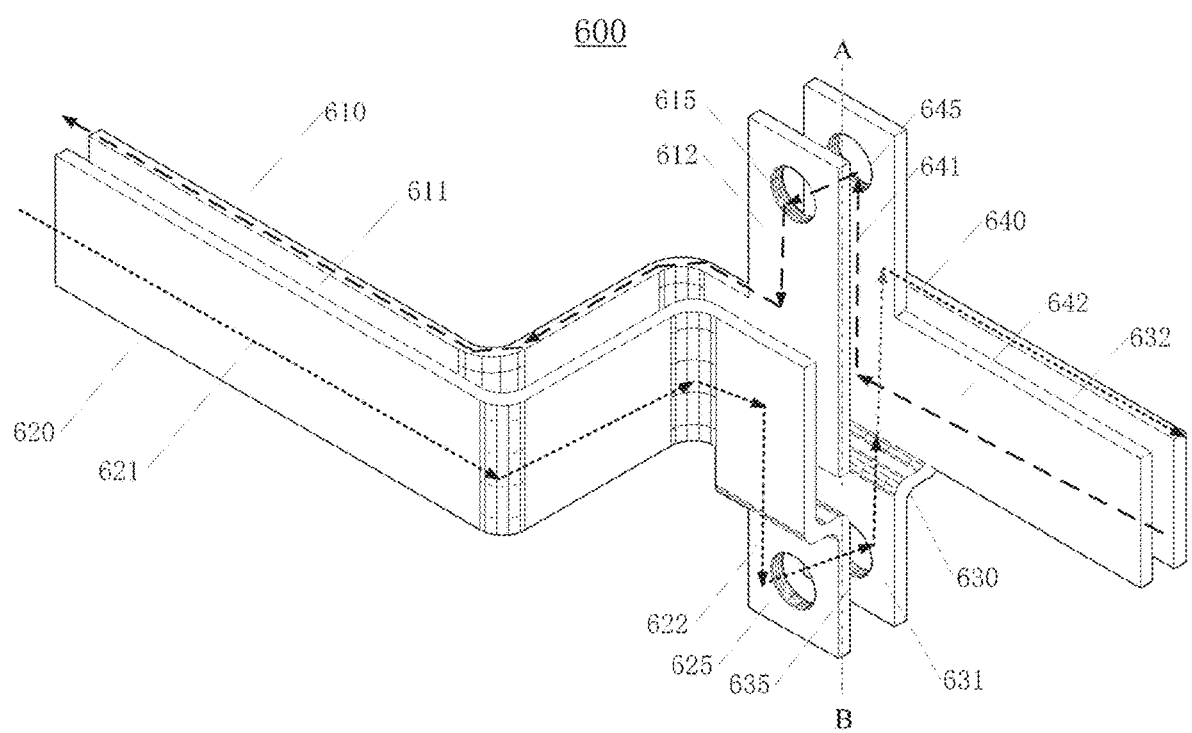
FIG. 6 is a schematic diagram of a component structure in an exemplary embodiment of the present disclosure.

Referring to FIG. 6, in one exemplary embodiment of the present disclosure, inside the power module, the first bus bar 610 includes a front portion of the first bus bar 611 and a rear portion of the first bus bar 612. The front portion of the first bus bar 611 and the rear portion of the first bus bar 612 are connected. The rear portion of the first bus bar 612 extends to the first plane A and the first connecting terminal 615 is formed. The second bus bar 620 includes a front portion of the second bus bar 621 and a rear portion of the second bus bar 622. The front portion of the second bus bar 621 and the rear portion of the second bus bar 622 are connected. The front portion of the second bus bar 621 is laminated in parallel with the front portion of the first bus bar 611, which may reduce the parasitic inductance inside the power module. The rear portion of the second bus bar 622 extends to the second plane B and the second connecting terminal 625 is formed. As shown in FIG. 6, an extending direction of the rear portion of the first bus bar 612 is opposite to that of the rear portion of the second bus bar 622. The first connecting terminal 615 and the second connecting terminal 625 may be served as connecting ports between the power module and the external circuit. The external circuit further includes a fourth bus bar 640 and the third bus bar 630. The third bus bar 630 has a front portion of the third bus bar 631 and a rear portion of the third bus bar 632, and the fourth bus bar 640 has a front portion of the fourth bus bar 641 and a rear portion of the fourth bus bar 642. The front portion of the third bus bar 630 is settled in parallel with the rear portion of the second bus bar 622, and the front portion of the third bus bar 631 is a portion of the third bus bar 630 settled in parallel with the rear portion of the second bus bar 622. The front portion of the fourth bus bar 641 is settled in parallel with the rear portion of the first bus bar 611, and the front portion of the fourth bus bar 641 is a portion of the fourth bus bar 640 settled in parallel with the rear portion of the first bus bar 612. The laminated structure may reduce the parasitic inductance between the first connecting terminal 615 and the second connecting terminal 625. At the same time, the rear portion of the fourth bus bar 642 and the rear portion of the third bus bar 632 are laminated in parallel, which further reduces the parasitic inductance between the first connecting terminal 615 and the second connecting terminal 625. It should be noted that only the partial structures of the third bus bar and the fourth bus bar are shown in the figure, and the third bus bar and the fourth bus bar may have a larger area and length to connect other elements of the external circuit. Since these structures are weakly related to the present disclosure, they are not shown in detail.

Further, surfaces where the rear portion of the second bus bar 622 and the front portion of the third bus bar 631 settled in parallel are respectively a first surface and a second surface. An area ratio of an overlapping area of the rear portion of the second bus bar 622 and the front portion of the third bus bar 631 to the first surface is greater than 0.5, and an area ratio of an overlapping area of the rear portion of the second bus bar 622 and the front portion of the third bus bar to the second surface is greater than 0.5. In this embodiment, the area ratio of the overlapping area to the first surface and the area ratio of the overlapping area to the second surface may be different. In order to further ensure a good parasitic inductance reduction effect, the area ratios of the overlapping area of the rear portion of the second bus bar and the front portion of the third bus bar to the first surface and the second surface may both be 1, which may further effectively reduce the parasitic inductance. That is, the rear portion of the second bus bar 622 and the front portion of the third bus bar 631 are overlapped in parallel, and surface areas of the oppositely disposed surfaces are equal.

Similarly, surfaces of the rear portion of the first bus bar 612 and the front portion of the fourth bus bar 641 disposed oppositely are respectively a third surface and a fourth surface. An area ratio of an overlapping area of the rear portion of the first bus bar 612 and the front portion of the fourth bus bar 641 to the third surface is greater than 0.5, and an area ratio of an overlapping area of the rear portion of the first bus bar 612 and the front portion of the fourth bus bar 641 to the fourth surface is greater than 0.5. In this embodiment, the area ratio of the overlapping area to the third surface and the area ratio of the overlapping area to the fourth surface may be different. In order to further ensure a good parasitic inductance reduction effect, the area ratios of the overlapping area of the rear portion of the first bus bar and the front portion of the fourth bus bar to the third surface and the fourth surface may both be 1, which may further effectively reduce the parasitic inductance. That is, the rear portion of the first bus bar 612 and the front portion of the fourth bus bar 641 are overlapped in parallel, and surface areas of the surfaces oppositely disposed are equal.

Similarly, surfaces of the rear portion of the fourth bus bar 642 and the rear portion of the third bus bar 632 disposed oppositely are respectively a fifth surface and a sixth surface. An area ratio of an overlapping area of the rear portion of the third bus bar 632 and the front portion of the fourth bus bar 642 to the fifth surface is greater than 0.5, and an area ratio of an overlapping area of the rear portion of the third bus bar 632 and the rear portion of the fourth bus bar 642 to the sixth surface is greater than 0.5. In this embodiment, the area ratio of the overlapping area to the fifth surface and the area ratio of the overlapping area to the sixth surface may be different. In order to further ensure a good parasitic inductance reduction effect, the area ratios of the overlapping area of the rear portion of the third bus bar and the rear portion of the fourth bus bar to the fifth surface and the sixth surface may both be 1, which may further effectively reduce the parasitic inductance. That is, the rear portion of the third bus bar 632 and the rear portion of the fourth bus bar 642 are overlapped in parallel, and surface areas of the oppositely disposed surfaces are equal.

As shown in FIG. 6, in the present exemplary embodiment, the front portion of the third bus bar 631 is provided with a third connecting terminal 635, and the third connecting terminal 635 is stacked and connected with the second connecting terminal 625. The rear portion of the fourth bus bar 641 is provided with a fourth connecting terminal 645, and the fourth connecting terminal 645 is stacked and connected with the first connecting terminal 615. For example, the third connecting terminal 635 and the second connecting terminal 625 may be electrically connected by mechanical fixing or the like, and the fourth connecting terminal 645 and the first connecting terminal 615 may also be electrically connected by mechanical fixing or the like.

FIG. 6 further shows the schematic diagram of the flow direction of the current in each part of the component structure 600, wherein the flow direction of the current is indicated by the dashed arrow in FIG. 6. It is assumed that the current flows from the first bus bar 610 into the power module and flows out from the second bus bar 620. As shown in FIG. 6, the current of the external circuit flows to the fourth connecting terminal 645 through the fourth bus bar 640. The fourth connecting terminal 645 is connected with the first connecting terminal 615, and the current flows into the first bus bar 610 through the first connecting terminal 615. Then, the current is switched from the first bus bar 610 to the second bus bar 620 through the circuit distribution design inside the power module and flows out from the second bus bar 620. The second connecting terminal 625 is connected with the third connecting terminal 635, and the current flows into the third connecting terminal 635 through the second connecting terminal 625, and then flows into the external circuit through the third bus bar 630. A wiring layer of the external circuit is not shown in detail, and it may usually implemented by a laminated bus bar, a PCB or a laminated copper bar, but not limited thereto. It should be noted that bus bar areas of the upper and lower layers shown in FIG. 6 are strictly identical, but in practice, since some electrodes need to be connected to a certain layer of the laminated bus bars, some avoidance space may need to be remained, resulting in that the bus bar areas of the upper and lower layers do not have to be strictly identical. Those skilled in the art may determine it flexibly according to needs, and no special explanation will be given here.

From the above, in the present exemplary embodiment, a current conducting direction of the front portion of the first bus bar 611 is opposite to that of the front portion of the second bus bar 621, a current conducting direction of the rear portion of the first bus bar 612 is opposite to that of the front portion of the fourth bus bar 641, a current conducting direction of the rear portion of the second bus bar 622 is opposite to that of the front portion of the third bus bar 631, and a current conducting direction of the rear portion of the third bus bar 632 is opposite to that of the rear portion of the fourth bus bar 642. The effect of reverse currents to cancel out each other is significant, and the parasitic inductance may be greatly reduced.

In addition, similar to the exemplary embodiment of FIG. 4, the rear portion of the second bus bar 622 may also be provided with a bending portion, such that the first plane A and the second plane B are located in the same plane. The front portion of the third bus bar 631 may also be provided with a bending portion, such that the front portion of the third bus bar 631 and the front portion of the fourth bus bar 641 are in the same plane, so that the interlayer distance can be further reduced, and then the parasitic inductance can be further reduced, which will not be described again herein.

It should be noted that only main structures of the component structure 600 are described in FIG. 6, in which the insulating layer is not shown, and the thickness, width and the like of the bus bar are also schematically depicted instead of being drawn in scale.

In the exemplary embodiments described above, the connecting terminals are all stacked and connected with each other, but the present disclosure is not limited thereto. In other exemplary embodiments of the present disclosure, the connecting terminals may also be in other forms, and other connecting manners may also be adopted correspondingly.

Figure 7:
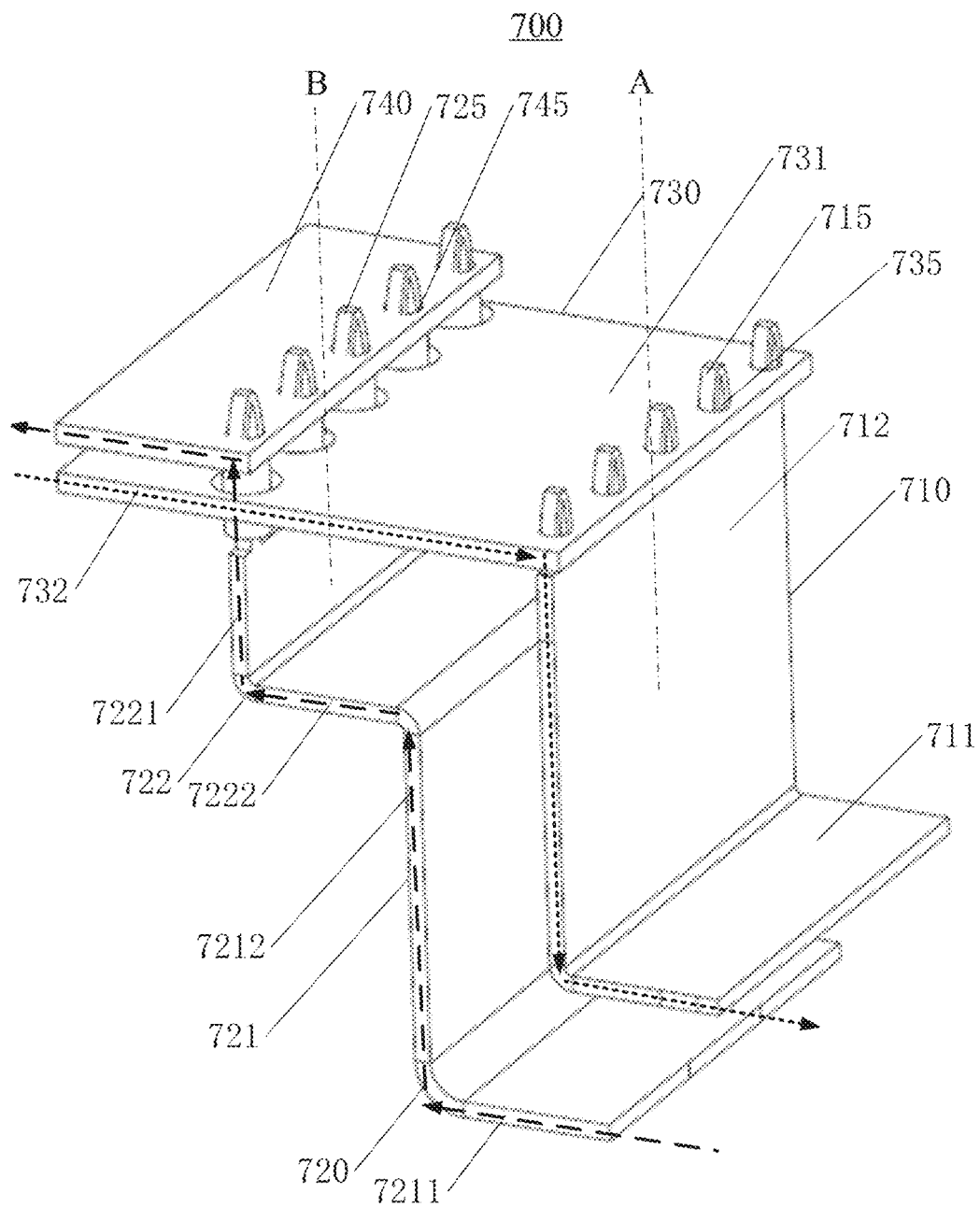
FIG. 7 is a schematic diagram of a component structure in an exemplary embodiment of the present disclosure.

Referring to FIG. 7, in one exemplary embodiment of the present disclosure, inside the power module, one end of the first bus bar 710 extends to the first plane A and the first connecting terminals 715 are formed. The first connecting terminals 715 are plug-in type terminals. The second bus bar 720 includes a front portion of the second bus bar 721 and a rear portion of the second bus bar 722, and the front portion of the second bus bar 721 and the rear portion of the second bus bar 722 are connected. The front portion of the second bus bar 721 and the first bus bar 710 are laminated in parallel. The rear portion of the second bus bar extends to the second plane B, and the second connecting terminals 725 are formed. The second connecting terminals 725 are plug-in type terminals. The first connecting terminals 715 and the second connecting terminals 725 are served as connecting ports between the power module and the external circuit. The external circuit includes a third bus bar 730 and a fourth bus bar 740. The third bus bar 730 has a front portion of the third bus bar 731 and a rear portion of the third bus bar 732. The front portion of the third bus bar 731 and the rear portion of the second bus bar 722 are settled in parallel, and the front portion of the third bus bar 731 is a portion of the third bus bar 730 disposed opposite to the rear portion of the second bus bar 722. The fourth bus bar 740 is laminated in parallel with the rear portion of the third bus bar 732. The parasitic inductance between the first connecting terminals 715 and the second connecting terminals 725 can be reduced through these stack settings. It should be noted that only partial structures of the third bus bar and the fourth bus bar are shown in the figure, and the third bus bar and the fourth bus may have a larger area and length to connect other elements of the external circuit. Since these structures are weakly related to the present disclosure, they are not shown in detail.

Further, surfaces of the rear portion of the second bus bar 722 and the front portion of the third bus bar 731 settled in parallel are a first surface and a second surface respectively. An area ratio of an overlapping area of the rear portion of the second bus bar 722 and the front portion of the third bus bar 731 to the first surface is greater than 0.5. In order to further ensure a good parasitic inductance reduction effect, an area ratio of the overlapping area of the rear portion of the second bus bar and the front portion of the third bus bar to the first surface may be 1. In order to further ensure a good parasitic inductance reduction effect, area ratios of the overlapping area of the rear portion of the second bus bar and the front portion of the third bus bar to the first surface and the second surface may both be 1, which may further effectively reduce the parasitic inductance. That is, the rear portion of the second bus bar 722 and the front portion of the third bus bar 731 are overlapped in parallel, and surface areas of the oppositely disposed surfaces are equal.

Similarly, surfaces of the fourth bus bar 740 and the rear portion of the third bus bar 732 disposed oppositely are respectively a third surface and a fourth surface. An area ratio of an overlapping area of the rear portion of the third bus bar 732 and the fourth bus bar 740 to the third surface is greater than 0.5, and an area ratio of an overlapping area of the rear portion of the third bus bar 732 and the fourth bus bar 740 to the fourth surface is greater than 0.5. In this embodiment, the area ratio of the overlapping area to the third surface and the area ratio of the overlapping area to the fourth surface may be different. In order to further ensure a good parasitic inductance reduction effect of the external circuit, the area ratios of the overlapping area of the rear portion of the third bus bar and the rear portion of the fourth bus bar to the third surface and the fourth surface may both be 1, which may further effectively reduce the parasitic inductance. That is, the rear portion of the third bus bar 732 and the fourth bus bar 740 are overlapped in parallel, and surface areas of the oppositely disposed surfaces are equal.

As shown in FIG. 7, in the present exemplary embodiment, the front portion of the third bus bar 731 is provided with the third connecting terminals 735, and the third connecting terminals 735 are connected with the first connecting terminals 715 in one to one ratio. The fourth bus bar 740 is provided with the fourth connecting terminals 745, and the fourth connecting terminals 745 are connected the second connecting terminals 725 in one to one ratio. Both the third connecting terminals 735 and the fourth connecting terminals 745 may be terminals that can be mated with the plug-in type terminals. For example, the third connecting terminals 735 and the first connecting terminals 715 can be electrically connected by welding or press-fit or the like. The fourth connecting terminals 745 and the second connecting terminals 725 can also be electrically connected by welding or press-fit or the like.

FIG. 7 further shows the schematic diagram of the flow direction of the current in each part of the component structure 700, wherein the flow direction of the current is indicated by the dashed arrow in FIG. 7. It is assumed that the current flows from the first bus bar 710 into the power module and flows out from the second bus bar 720. As shown in FIG. 7, the current of the external circuit flows to the third connecting terminal 735 through the third bus bar 730. The first connecting terminal 715 is connected to the third connecting terminal 735, and the current flows into the first bus bar 710 through the first connecting terminal 715. The current is then switched from the first bus bar 710 to the second bus bar 720 through the circuit distribution design inside the power module and flows out from the second bus bar 720. The current flows into the fourth connecting terminal 745 through the second connecting terminal 725, and then flows into the external circuit through the fourth bus bar 740. A wiring layer of the external circuit is not shown in detail, and it may usually implemented by a laminated bus bar, a PCB or a laminated copper bar, but not limited thereto. It should be noted that bus bar areas of the upper and lower layers shown in FIG. 7 are strictly identical, but in practice, since some electrodes need to be connected to a certain layer of the laminated bus bars, some avoidance space may need to be remained. For example, through holes and the like for avoiding the second connecting terminals 725 needs to be set on the third bus bar 730. It results in that the bus bar areas of the upper and lower layers do not have to be strictly identical. Those skilled in the art may determine it flexibly according to needs, and no special explanation will be given here.

In the present exemplary embodiment, the first bus bar 710 overlaps with the front portion of the second bus bar 721, and the interlayer distance is relatively small. Due to limitations of voltage isolation and material or the like, the thickness of the bus bar is generally between 20 µm and 500 µm. Because the direction of the current inside the first bus bar 710 is opposite to that of the current inside the front portion of the second bus bar 721, the loop inductance of this portion is relatively low, which may be usually limited to between 0~9 nH. Due to considerations of voltage isolation or the like, a distance of the rear portion of the second bus bar 722 is relatively long (usually greater than 5 mm), resulting in a large parasitic inductance, which is usually larger than 10 nH. Thus the rear portion of the second bus bar 722 becomes a major factor affecting the loop inductance. However, in the present exemplary embodiment, since the front portion of the third bus bar 731 of the external circuit and the rear portion of the second bus bar 722 are superimposed in parallel or overlapped in parallel with a large overlapping area, and the current direction of the front portion of the third bus bar 731 is opposite to that of the rear portion of the second bus bar 722, the loop inductance can be partially or completely counteracted, so that its parasitic inductance is greatly reduced.

From the above, in the present disclosure, a current conducting direction of the first bus bar 710 is opposite to that of the front portion of the second bus bar 721, a current conducting direction of the rear portion of the second bus bar 722 is opposite to that of the front portion of the third bus bar 731, and a current conducting direction of the rear portion of the third bus bar 732 is opposite to that of the fourth bus bar 740. The counteracting effect of the opposite currents is significant, and the parasitic inductance can be greatly reduced. The overall circuit parasitic inductance of the component structure 700 is greatly reduced. Therefore, the present disclosure effectively solves the problem of large circuit inductance through the design of a laminated bus bar inside the power module and the cooperation with the bus bar of the external circuit.

In addition, similar to the exemplary embodiment in FIG. 4, the first bus bar 710 further includes a first extending portion 711 and a first bending portion 712. The first bending portion 712 is located in the first plane A. The first connecting terminals 715 are disposed at an end of the first bending portion 712. The front portion of the second bus bar 721 further includes a second extending portion 7211 and a second bending portion 7212. The first extending portion 711 and the second extending portion 7211 are laminated in parallel, and the first bending portion 712 and the second bending portion 7212 are laminated in parallel. The rear portion of the second bus bar further includes a third extending portion 7221 and a third bending portion 7222. The third bending portion 7222 is connected to the second bending portion 7212, and the third extending portion 7221 is located in the second plane B. The second connecting terminals 725 are disposed at an end of the third extending portion 7221, which will not be described again here.

It should be noted that only main structures of the component structure 700 are described in FIG. 7, in which the insulating layer is not shown, and the thickness, width and the like of the bus bar are also schematically depicted instead of being drawn in scale.

Figure 8:
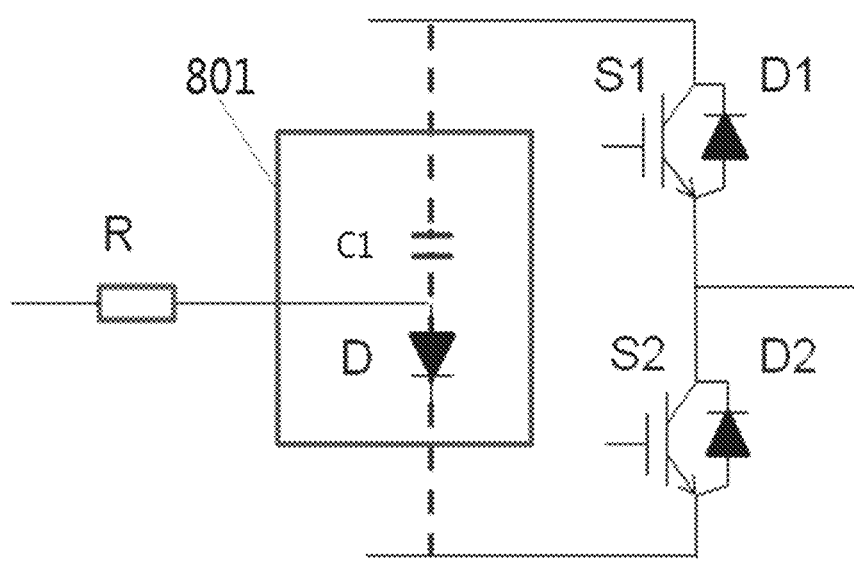
FIG. 8 is a schematic diagram of a half-bridge power circuit with diode clamping.
Figure 9:
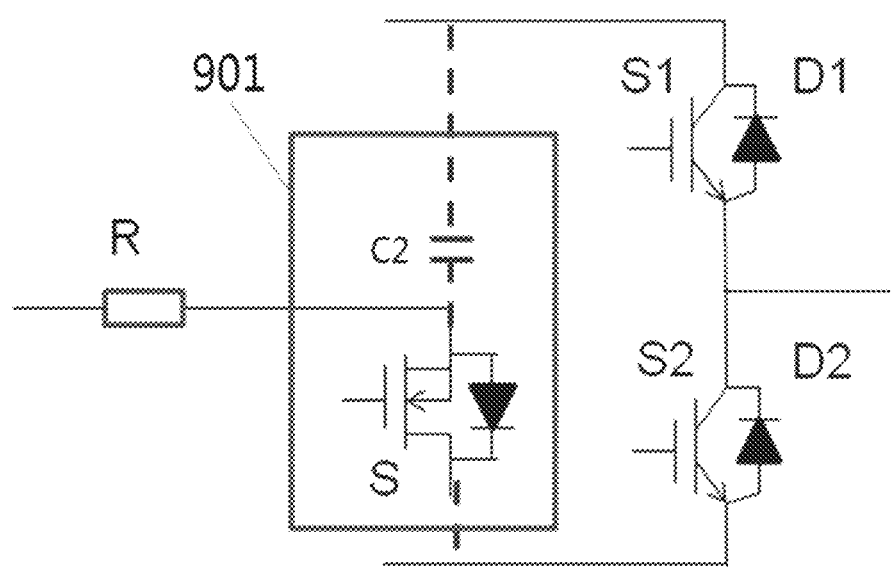
FIG. 9 is a schematic diagram of a half-bridge power circuit with active clamping.

In the previous exemplary embodiments, the corresponding power modules are two-port structures, and there are two output terminals. A typical application of the power module may be the half-bridge power circuit with capacitor clamping as shown in FIG. 1, a half-bridge power circuit with diode clamping as shown in FIG. 8, a half-bridge power circuit with active clamping as shown in FIG. 9 and the like. These typical applications will be described in detail below.

The half-bridge circuit with capacitor clamping as shown in FIG. 1 is taken as an example, in which a first IGBT element S1 and a second IGBT element S2 are connected in parallel with a diode D1 and a diode D2 respectively, then connected in series, and then the bridge arm circuit formed by the series connection is further connected in parallel with the capacitor C of the external clamping circuit. The capacitor C can effectively reduce the voltage spike between a collector of the first IGBT element S1 and an emitter of the second IGBT element S2 during switching. For example, when the first IGBT element S1 is turned on and the second IGBT element S2 is turned off, the capacitor C can reduce the voltage between the collector and the emitter of the second IGBT element S2. When the first IGBT element S1 is turned off and the second IGBT element S2 is turned on, the capacitor C can reduce the voltage between the collector and the emitter of the first IGBT element S1. At the same time, the parasitic inductance of the current loop composed of the first IGBT element S1, the second IGBT element S2 and the capacitor C needs to be strictly controlled. In view of this, in the present embodiment, the collector of the first IGBT element S1 and the emitter of the second IGBT element S2 may be respectively led to the first connecting terminal and the second connecting terminal which are the ports of the power module through the first bus bar and the second bus bar, and connected to the capacitor C of the external circuit through the third connecting terminal and the fourth connecting terminal. The connection between the power module and the external circuit is realized through the component structure in the above exemplary embodiment, and a low loop parasitic inductance can be obtained, thereby reducing the voltage stress experienced by the power elements and improving the efficiency of the circuit.

Referring to FIG. 8, a schematic diagram of a half-bridge power circuit with diode clamping is shown. The circuit connection is basically the same as the half-bridge circuit with capacitor clamping as shown in FIG. 1 except that the capacitor C in FIG. 1 is replaced by a diode clamping circuit 801. The diode clamping circuit 801 includes a capacitor C1, a diode D and a snubber resistor R. Similarly, the parasitic inductance of the current loop composed of the first IGBT element S1, the second IGBT element S2 and the diode D needs to be strictly controlled. In view of this, in the present embodiment, the collector of the first IGBT element S1 and the emitter of the second IGBT element S2 may be respectively led to the first connecting terminal and the second connecting terminal Which are the ports of the power module through the first bus bar and the second bus bar, and connected to the capacitor C1 of the external circuit and the diode D through the third connecting terminal and the fourth connecting terminal. The connection between the power module and the external circuit is realized through the component structure in the above exemplary embodiment, and a low loop parasitic inductance can be obtained, thereby reducing the voltage stress experienced by the power element and improving the efficiency of the circuit.

Referring to FIG. 9, a schematic diagram of a half-bridge power circuit with active clamping is shown. The circuit connection is basically the same as the half-bridge circuit with capacitor clamping as shown in FIG. 1 except that the capacitor C in FIG. 1 is replaced by an active clamping circuit 901. The active clamping circuit 901 includes a capacitor C2, a power semiconductor element S and a snubber resistor R. Similarly, the parasitic inductance of the commutation loop composed of the first IGBT element S1, the second IGBT element S2, the capacitor C2 and the power semiconductor element S needs to be strictly controlled. In view of this, in the present embodiment, the collector of the first IGBT element S1 and the emitter of the second IGBT element S2 may be respectively led to the first connecting terminal and the second connecting terminal which are the ports of the power module through the first bus bar and the second bus bar, and connected to the capacitor C2 of the external circuit and the power semiconductor element S through the third connecting terminal and the fourth connecting terminal. The connection between the power module and the external circuit is realized through the component structure in the above exemplary embodiment, and a low loop parasitic inductance can be obtained, thereby reducing the voltage stress experienced by the power element and improving the efficiency of the circuit.

Figure 10:
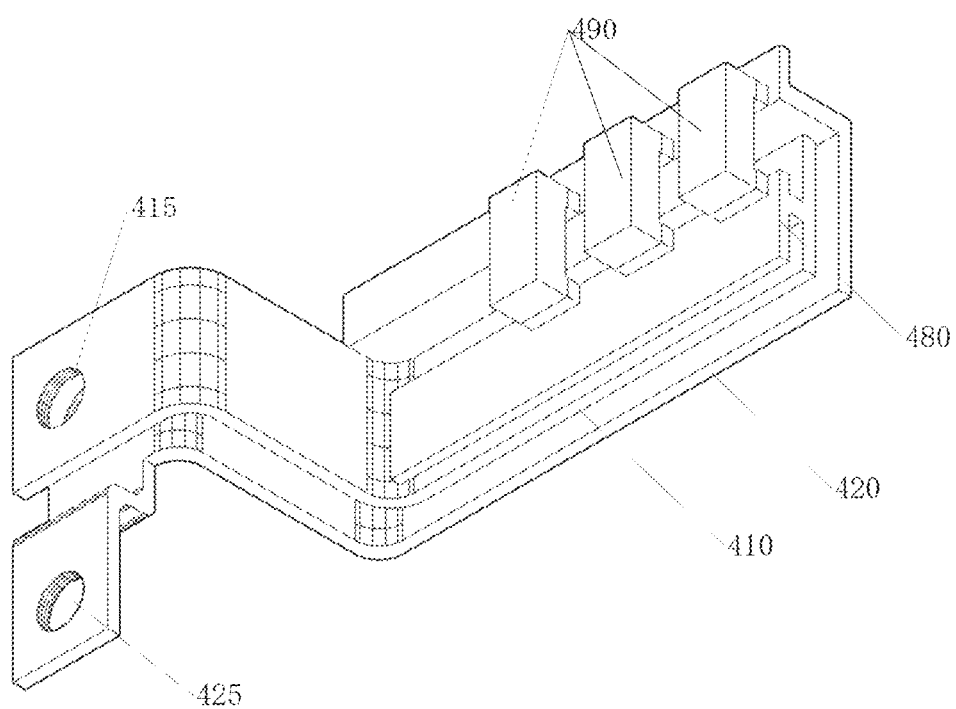
FIG. 10 is a schematic diagram of a manner of mounting elements of the component structure in an exemplary embodiment of the present disclosure.
Figure 11:
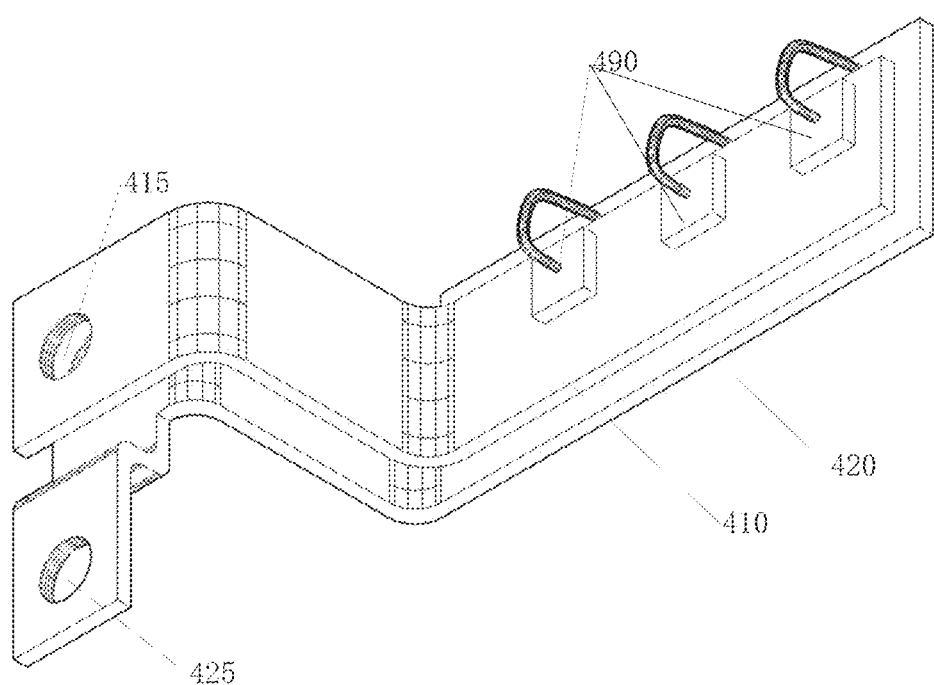
FIG. 11 is a schematic diagram of a manner of mounting elements of the component structure in an exemplary embodiment of the present disclosure.
Figure 12:
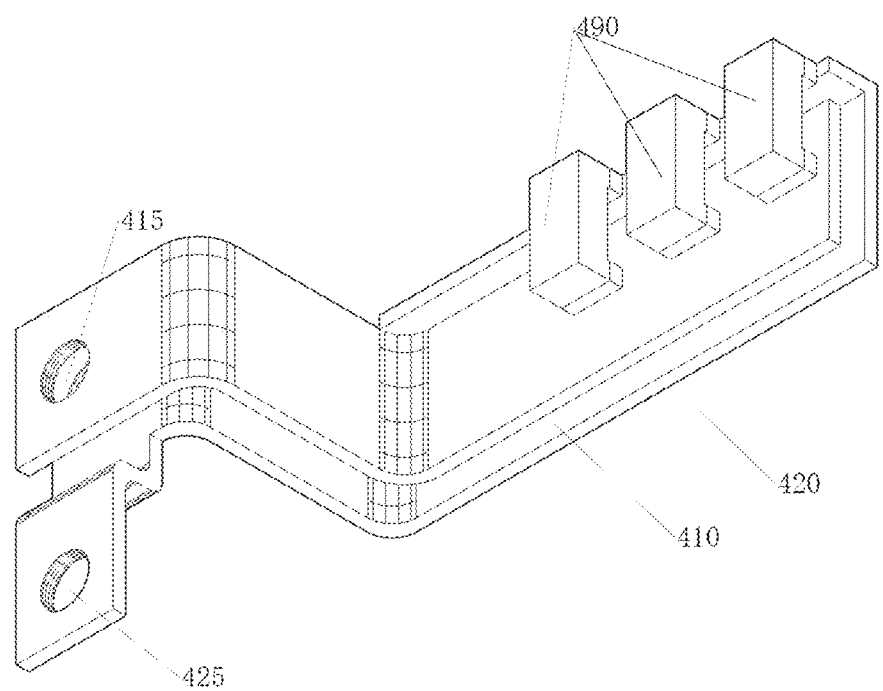
FIG. 12 is a schematic diagram of a manner of mounting elements of the component structure in an exemplary embodiment of the present disclosure.

It should be noted that all or some of the elements of the clamping circuits may be disposed on the internal laminated bus bar or on the external circuit unit. Persons of ordinary skill in the art can change the form of the internal laminated bus bars slightly as needed. For example, as shown in FIG. 10, a wiring layer 480 of the mounting elements 490 can be added additionally, to achieve the placement of the elements 490. As another example, as shown in FIG. 11, it is also possible to allocate the partial position of a layer in the internal laminated bus bars to the same surface of another layer by rewiring, so as to directly mount the elements 490 through the SMT (Surface Mount Technology) process. As still another example, as shown in FIG. 12, the elements 490 can also be mounted on a layer of the laminated bus bars, and a partial position of another layer of the laminated bus bars is exposed, and the electrical connection is achieved by a wire bonding process. In addition, it is easily understood that, circuit elements for realizing other functions, such as a driving circuit or the like, may also be mounted on the internal laminated bus bar, which is not particularly limited in this exemplary embodiment. In addition, the laminated bus bars may also lead out other signal terminals in addition to the power terminals, which will not be described in detail herein.

In the following exemplary embodiments, the corresponding power modules are all three-port structures, that is, there are three output terminals, which will be described in detail below.

Figure 13:
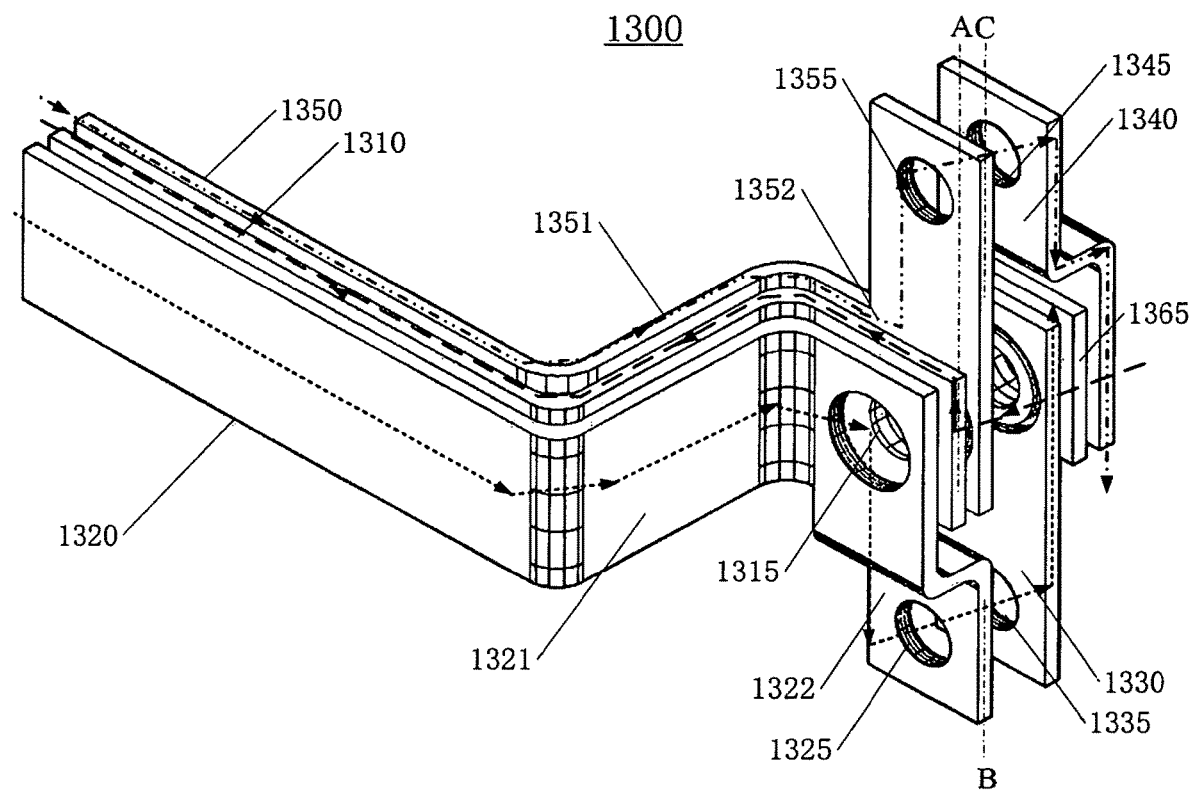
FIG. 13 is a schematic diagram of a component structure in an exemplary embodiment of the present disclosure.

Referring to FIG. 13, in the component structure 1300 of one exemplary embodiment of the present disclosure, inside the power module, in addition to the first bus bar 1310 and the second bus bar 1320, a fifth bus bar 1350 is further included. In the embodiment, one end of the first bus bar 1310 extends to a first plane A and a first connecting terminal 1315 is formed. The second bus bar 1320 includes a front portion of the second bus bar 1321 and a rear portion of the second bus bar 1322. The front portion of the second bus bar 1321 and a rear portion of the second bus bar 1322 are connected. The front portion of the second bus bar 1321 is laminated in parallel with the first bus bar 1310. The rear portion of the second bus bar 1322 extends to a second plane B and a second connecting terminal 1325 is formed. The fifth bus bar 1350 includes a front portion of the fifth bus bar 1351 and a rear portion of the fifth bus bar 1352. The front portion of the fifth bus bar 1351 and the rear portion of the fifth bus bar 1352 are connected. The front portion of the fifth bus bar 1351 is laminated in parallel with the first bus bar 1310. The rear portion of the fifth bus bar 1352 extends to a third plane C and a fifth connecting terminal 1355 is formed. The first connecting terminal 1315, the second connecting terminal 1325 and the fifth connecting terminal 1355 are served as connecting ports between the power module and the external circuit. The external circuit includes a third bus bar 1330 and a fourth bus bar 1340. The third bus bar 1330 is settled in parallel with the rear portion of the second bus bar 1322, to reduce the parasitic inductance between the first connecting terminal 1315 and the second connecting terminal 1325. The fourth bus bar 1340 is settled in parallel with the rear portion of the fifth bus bar 1352, to reduce the parasitic inductance between the first connecting terminal 1315 and the fifth connecting terminal 1355.

It should be noted that only the partial structures of the third bus bar and the fourth bus bar are shown in the figure, and the third bus bar and the fourth bus bar may have a larger area and length to connect other elements of the external circuit. Since the subsequent structures are weakly related to the present disclosure, they are not shown in detail.

A portion of the third bus bar 1330 disposed opposite to the rear portion of the second bus bar 1322 is further defined as a front portion of the third bus bar. Surfaces of the rear portion of the second bus bar 1322 and the front portion of the third bus bar disposed oppositely are a first surface and a second surface respectively. An area ratio of an overlapping area of the rear portion of the second bus bar 1322 and the front portion of the third bus bar to the first surface is greater than 0.5, and an area ratio of an overlapping area of the rear portion of the second bus bar 1322 and the front portion of the third bus bar to the second surface is greater than 0.5. In this embodiment, the area ratio of the overlapping area to the first surface and the area ratio of the overlapping area to the second surface may be different. In order to further ensure a good parasitic inductance reduction effect, the area ratios of the overlapping area of the rear portion of the second bus bar and the front portion of the third bus bar to the first surface and the second surface may both be 1, which may further effectively reduce the parasitic inductance. That is, the rear portion of the second bus bar 1322 and the front portion of the third bus bar are overlapped in parallel, and surface areas of the oppositely disposed surfaces are equal.

Similarly, a portion of the fourth bus bar 1340 disposed opposite to the rear portion of the fifth bus bar 1352 is further defined as a front portion of the fourth bus bar. Surfaces of the rear portion of the fifth bus bar 1352 and the front portion of the fourth bus bar disposed oppositely are a third surface and a fourth surface respectively. An area ratio of an overlapping area of the rear portion of the fifth bus bar 1352 and the front portion of the fourth bus bar to the third surface is greater than 0.5, and an area ratio of an overlapping area of the rear portion of the fifth bus bar 1352 and the front portion of the fourth bus bar to the fourth surface is greater than 0.5. In this embodiment, the area ratio of the overlapping area to the third surface and the area ratio of the overlapping area to the fourth surface may be different. In order to further ensure a good parasitic inductance reduction effect, the area ratios of the overlapping area of the rear portion of the fifth bus bar and the front portion of the fourth bus bar to the third surface and the fourth surface may both be 1, which may further effectively reduce the parasitic inductance. That is, the rear portion of the fifth bus bar 1352 and the front portion of the fourth bus bar are overlapped in parallel and surface areas of the oppositely disposed surfaces are equal.

As shown in FIG. 13, in the present exemplary embodiment, one end of the third bus bar 1330 is provided with a third connecting terminal 1335, and the third connecting terminal 1335 is stacked and connected with the second connecting terminal 1325. For example, the third connecting terminal 1335 and the second connecting terminal 1325 can be electrically connected by mechanical fixing or the like. One end of the fourth bus bar 1340 is provided with a fourth connecting terminal 1345, and the fourth connecting terminal 1345 is stacked and connected with the fifth connecting terminal 1355. For example, the fourth connecting terminal 1345 and the fifth connecting terminal 1355 can be electrically connected by mechanical fixing or the like. The external circuit is further provided a sixth connecting terminal 1365, and the sixth connecting terminal 1365 and the first connecting terminal 1315 are stacked and connected. For example, the sixth connecting terminal 1365 and the first connecting terminal 1315 may be electrically connected by mechanical fixing or the like through a through hole avoided in the third bus bar 1330 and the fifth bus bar 1350.

FIG. 13 further shows the schematic diagram of the flow direction of the current in each part of the component structure 1300, wherein the flow direction of the current is indicated by the dashed arrow in FIG. 13. As for a three-port element, there are two loop current paths. The first loop current path is as follows: the external current flows into the first bus bar 1310 inside the module through the sixth connecting terminal 1365, and flows out from the second connecting terminal 1325 of the second bus bar 1320 and then flows into the third bus bar 1330. The other loop current path is as follows: the external current flows into the first bus bar 1310 inside the module through the sixth connecting terminal 1365, and flows out from the fifth connecting terminal 1355 of the fifth bus bar 1350, and then flows into the fourth bus bar 1340. Specifically, continuing to refer to FIG. 13, as for the first loop current path, the current of the external circuit flows to the first connecting terminal 1315 via the sixth connecting terminal 1365; the current flows into the first bus 1310 through the first connecting terminal 1315; then the current is switched from the first bus bar 1310 to the second bus bar 1320 through the circuit distribution design inside the power module, and flows out from the second bus bar 1320; the current flows into the third connecting terminal 1335 through the second connecting terminal 1325, and the current flows into the third bus bar 1330 through the third connecting terminal 1335, and then flows into the external circuit through the third bus bar 1330. As for the second loop current path, as shown in FIG. 13, the current of the external circuit flows to the first connecting terminal 1315 via the sixth connecting terminal 1365; the current flows into the first bus bar 1310 through the first connecting terminal 1315; then the current is switched from the first bus bar 1310 to the fifth bus bar 1350 through the circuit distribution design inside the power module, and flows out from the fifth bus bar 1350; the current flows into the fourth bus bar 1345 through the fifth connecting terminal 1355, and then flows into the fourth bus bar 1340 through the fourth connecting terminal 1345 and then flows into the external circuit. A wiring layer of the external circuit is not shown in detail, and it may usually implemented by a laminated bus bar, a PCB or a laminated copper bar, but not limited thereto. It should be noted that bus bar areas of the upper and lower layers shown in FIG. 13 are strictly identical, but in practice, since some electrodes need to be connected to a certain layer of the laminated bus bars, some avoidance space may need to be remained, resulting in that the bus bar areas of the upper and lower layers do not have to be strictly identical. Those skilled in the art may determine it flexibly according to needs, and no special explanation will be given here.

From the above, in the present disclosure, a current conducting direction of the first bus bar 1310 is opposite to that of the front portion of the second bus bar 1321, a current conducting direction of the first bus bar 1310 is opposite to that of the front portion of the fifth bus bar 1351, a current conducting direction of the rear portion of the second bus bar 1322 is opposite to that of the third bus bar 1330, and a current conducting direction of the rear portion of the fifth bus bar 1352 is opposite to that of the fourth bus bar 1340. Since conducting directions of the current are opposite and the counteracting effect of the opposite currents is significant, the parasitic inductance can be greatly reduced.

In addition, similar to the previous exemplary embodiment in FIG. 4, the rear portion of the second bus bar 1322 may also be provided with a bending portion, such that the first plane A and the third plane C are located in the same plane. The interlayer distance can be further reduced, and then the parasitic inductance can be further reduced, which will not be described again herein.

In the above-described exemplary embodiment of FIG. 13, the first bus bar 1310 is disposed between the front portion of the second bus bar 1321 and the front portion of the fifth bus bar 1351, but in other exemplary embodiments of the present disclosure, it is also possible to adopt other settings.

Figure 14:
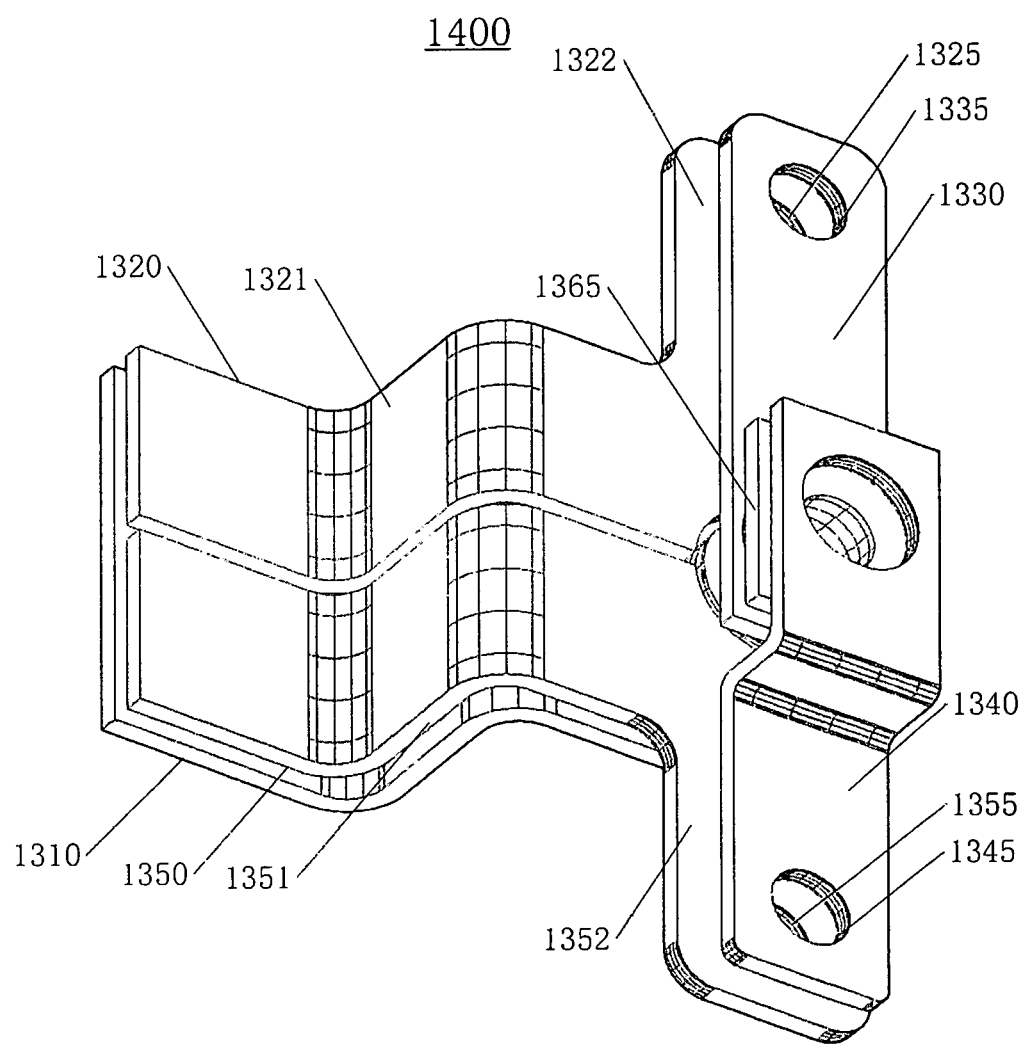
FIG. 14 is a schematic diagram of a component structure in an exemplary embodiment of the present disclosure.

As shown in FIG. 14, in one exemplary embodiment of the present disclosure, the front portion of the second bus bar 1321 and the front portion of the fifth bus bar 1351 of the component structure 1300 are arranged in parallel. That is, the front portion of the second bus bar 1321 and the front portion of the fifth bus bar 1351 are disposed in the same layer. By arranging the front portion of the second bus bar 1321 and the front portion of the fifth bus bar 1351 in parallel, the thickness of the power module can be reduced, thereby facilitating the realization of an ultrathin product. The other parts of the component structure in this exemplary embodiment are similar to those of the previous exemplary embodiment of FIG. 13, and thus will not be described again here.

Figure 15:
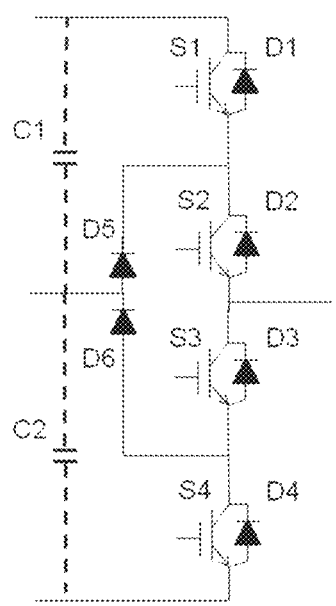
FIG. 15 is a schematic diagram of a three-level circuit with a clamping circuit.
Figure 16:
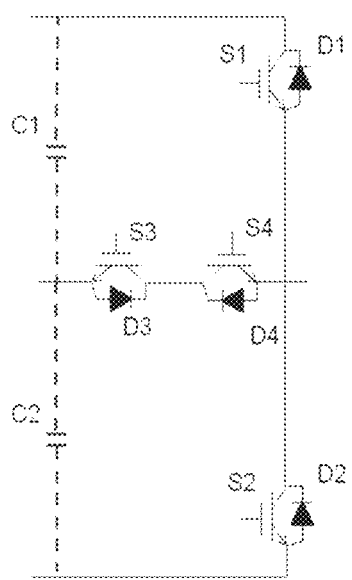
FIG. 16 is a schematic diagram of a T-type three-level power circuit with a snubber capacitor.

In the previous exemplary embodiments in FIGS. 13 and 14, the corresponding power modules are all three-port structures. There are three output terminals. A typical application of the power module may be a three-level circuit with a clamping circuit as shown in FIG. 15, or a T-type three-level power circuit with a snubber capacitor as shown in FIG. 16. These typical applications will be described in detail below.

Referring to FIG. 15, a schematic diagram of a three-level power circuit with a clamping circuit is shown. A first IGBT element S1, a second IGBT element S2, a third IGBT element S3, and a fourth IGBT element S4 are connected in parallel with a diode D1, a diode D2, a diode D3 and a diode D4 respectively, and then connected in series to form a bridge arm circuit. The bridge arm circuit is connected in parallel with a branch circuit formed by connecting the capacitor C1 and the capacitor C2 in series. The branch circuit formed by series connection of the third IGBT element S3 and the fourth IGBT element S4 in the bridge arm circuit is connected in parallel with the branch circuit formed by connecting the diode D5 and the diode D6 in series. A connection point (hereinafter referred to as a common terminal) of the capacitor C1 and the capacitor C2 is connected with a connection point of the diode D5 and the diode D6. In this circuit, the capacitor C1 as a control element can reduce the voltage spike between the collector of the first IGBT element S1 and the anode of the diode D5 during switching. For example, when the first IGBT element S1 is turned on and the diode D5 is reversely blocked, the capacitor C1 can reduce the voltage between the anode and cathode of the diode D5. When the diode D5 is conducting forward and the first IGBT element S1 is turned off, the capacitor C1 can reduce the voltage between the collector and the emitter of the first IGBT element S1. The capacitor C2 as a control element can reduce the voltage spike between the emitter of the fourth IGBT element S4 and the cathode of the diode D6. For example, when the fourth IGBT element S4 is turned on and the diode D6 is reversely blocked, the capacitor C2 can reduce the voltage between the anode and cathode of the diode D6. When the diode D6 is conducting forward and the fourth IGBT element S4 is turned off, the capacitor C2 can reduce the voltage between the collector and the emitter of the fourth IGBT element S4. At the same time, the parasitic inductance of the commutation loop composed of the first IGBT element S1, the diode D5, and the capacitor C1 and the current loop composed of the fourth IGBT element S4, the diode D6, and the capacitor C2 needs to be strictly controlled. In view of this, in the present embodiment, the collector of the first IGBT element S1 and the emitter of the fourth IGBT element S4 may be respectively connected to the second connecting terminal and the fifth connecting terminal of the power module through the second bus bar and the fifth bus bar, and connected to the capacitors C1 and C2 of the external circuit through the third connecting terminal and the fourth connecting terminal. The common terminal can be connected to the first connecting terminal of the power module via the first bus bar, and connected to the external circuit through the sixth connecting terminal. The connection between the power module and the external circuit is realized through the component structure in the above exemplary embodiment, and a low loop parasitic inductance can be obtained, thereby reducing the voltage stress experienced by the power element and improving the efficiency of the circuit.

Referring to FIG. 16, a schematic diagram of a T-type three-level power circuit with a snubber capacitor is shown. A first IGBT element S1, a second IGBT element S2 are connected in parallel with a diode D1, a diode D2 respectively, and then connected in series to form a bridge arm circuit. The bridge arm circuit is connected in parallel with a branch circuit formed by connecting the capacitor C1 and the capacitor C2 in series. The third IGBT element S3 and the fourth IGBT element S4 are connected in parallel with the diodes D3 and D4 respectively, and then connected in series to form a branch circuit. The branch circuit is connected in series between a midpoint of the bridge circuit and a connection point (hereinafter referred to as a common terminal) of the capacitor C1 and the capacitor C2. Specifically, it may be the case that the emitter of the third IGBT element S3 is connected to the common terminal, and the collector of the fourth IGBT element S4 is connected to the midpoint of the bridge arm circuit. Similarly, the parasitic inductance of the current loop composed of the first IGBT element S1, the fourth IGBT element S4, the diode D3, and the capacitor C1 and the current loop composed of the second IGBT element S2, the third IGBT element S3, the diode D4, and the capacitor C2 needs to be strictly controlled. In view of this, in the present embodiment, the collector of the first IGBT element S1 and the emitter of the second IGBT element S2 may be respectively connected to the second connecting terminal and the fifth connecting terminal of the power module through the second bus bar and the fifth bus bar, and connected to the capacitors C1 and C2 of the external circuit through the third connecting terminal and the fourth connecting terminal. The common terminal can be connected to the first connecting terminal of the power module via the first bus bar, and connected to the external circuit through the sixth connecting terminal. The connection between the power module and the external circuit is realized through the component structure in the above exemplary embodiment, and a low loop parasitic inductance can be obtained, thereby reducing the voltage stress experienced by the power element and improving the efficiency of the circuit.

From the typical application of the power modules in the above exemplary embodiments, it can be seen that the power modules applied in the present disclosure generally includes at least two power elements connected in series, and at least one of the power elements is a controllable element, such as an MOSFET, an IGBT, a SiC MOS, a GaN MOS. The basic features of the controllable element are all controllable three-port power elements including a first terminal, a second terminal, and a control terminal. Another power element can be a controllable element or an uncontrollable element, such as a diode or the like. Therefore, the component structure in the present disclosure has a wide range of applications, for example, it can be widely applied to power conversion equipment such as solar inverters, uninterruptible power supplies, active filters, and motor drives.

Further, a power module is also provided in an exemplary embodiment of the present disclosure. The power module may include a substrate, a power unit, and a component structure in any one of the above-described exemplary embodiments. In the embodiment, the power unit is disposed on the substrate, and the component structure connects the power unit and an external circuit. The power module will be further described below with reference to FIGS. 17 and 18.

Figure 17:
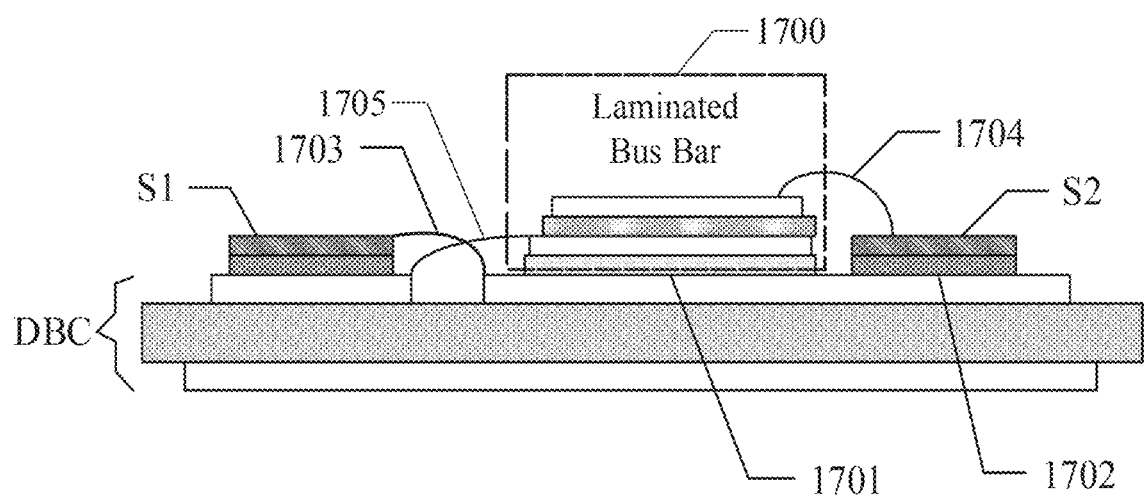
FIG. 17 is a schematic sectional view of a power module in an exemplary embodiment of the present disclosure.

Referring to FIG. 17, the substrate may be a DBC (Direct Bonding Copper). However, in other exemplary embodiments of the present disclosure, the substrate may also be an Active Metal Bonding (AMB), an Insulated Metal Substrate (IMS), a Direct Plated Copper (DPC) or a thick film circuit and so on. In addition, in order to improve the heat dissipation performance of the power module, a heat dissipation structure, such as a heat sink, a fin, a boss and the like may be integrated at one side of the substrate where a device is not mounted.

The power unit may include a power element S1 and a power element S2 provided on a DBC substrate. The power element S1 and the power element S2 may be disposed on the substrate DBC through a die bonding material layer 1702. The material of the die bonding material layer 1702 may be a brazing material, a low temperature sintering material, a conductive adhesive, or the like, which is not specifically limited in the present exemplary embodiment. The power element S1 and the power element S2 are connected in series. The first end of the power unit may be one end of the power element S1, such as the drain electrode of the power element S1. The second end of the power unit may be one end of the power element S2, such as the source electrode of the power element S2.

The component structure 1700 includes two layers of laminated bus bars, which may be the first bus bar and the second bus bar respectively in the previous exemplary embodiment of FIG. 4. The lower layer of the laminated bus bars may be mechanically and thermally connected to the substrate DBC through the adhesive material layer 1701. An insulating medium such as a ceramic is provided between two layers of the laminated bus bars. When the insulating medium is a ceramic, the ceramic material may be aluminum oxide, aluminum nitride, silicon nitride, silicon carbide, and beryllium oxide or the like. This is not particularly limited in the exemplary embodiment.

The power unit is connected to the component structure. For example, the first end (front electrode) of the power element S1 is connected to the wiring layer of the substrate DCB through the lead 1703, and the second end (back electrode) of the power element S1 is connected to the lower layer of the laminated bus bars through the lead 1705. The first end of the power element S2 is connected to the upper layer of the laminated bus bars through the lead 1704, and the second end of the power element S2 is led out through the wiring layer of the substrate DCB. Specifically, referring to FIGS. 17 and 2, it can be the case that the source electrode of the power element S1 is connected to the wiring layer of the substrate DBC through the bonding wire 1703, and the drain electrode of the power element S1 is connected to the lower layer of the laminated bus bars through the lead 1705. The source electrode of the power element S2 is connected to the upper layer of the laminated bus bars through a bonding wire 1704, and the drain electrode is connected to the DCB wiring layer of the substrate. However, it is easy to understand that other feasible connection manners also fall within the protection scope of the present disclosure.

It should be noted that the material for insulation protection is not shown in the power module shown in FIG. 17. The insulation protection material can guarantee the voltage withstand requirements between the chip and the electrical connection unit. There are two kinds of typical protection manners in the art. One is the potting insulation protection material, and the other is transfer molding the insulating protection material, both of which are within the protection scope of the present disclosure.

In addition, for the purpose of insulation, it is also possible to cover the surface of the laminated bus bar with a high-voltage insulating material and open a window in a part that needs to be electrically connected with the outside. The above content can be referred to the prior art and is not shown in detail in the figure. The control terminal of the power element or the like are not shown in the figure either, which can also refer to the prior art. In addition, in practical applications, the laminated bus bars may not be limited to one unit, but may have a plurality of double-layered structures, to achieve different currents and circuit requirements. The surface of the laminated bus bars may also set graphic regions according to circuit requirements. In addition, components and parts, such as a gate resistor, a driver chip, and the like are provided thereon, which is not specifically limited in this exemplary embodiment.

It should be noted that in FIG. 17, the two-layer laminated bus bar is taken as an example for description. However, when the power unit also has the third terminal and is a three-port structure, the laminated bus bar may also be set as three layers. For example, the third layer of the laminated bus bars may be the fifth bus bar in the above exemplary embodiment, and the third end of the power unit is connected with the fifth bus bar. Alternatively, the laminated bus bar is provided in two layers, but one of the layers is provided to be two bus bars arranged in parallel, and the additionally arranged bus bar may be the fifth bus bar in the above exemplary embodiment, and the third terminal of the power unit is connected to the fifth bus bar.

Figure 18:
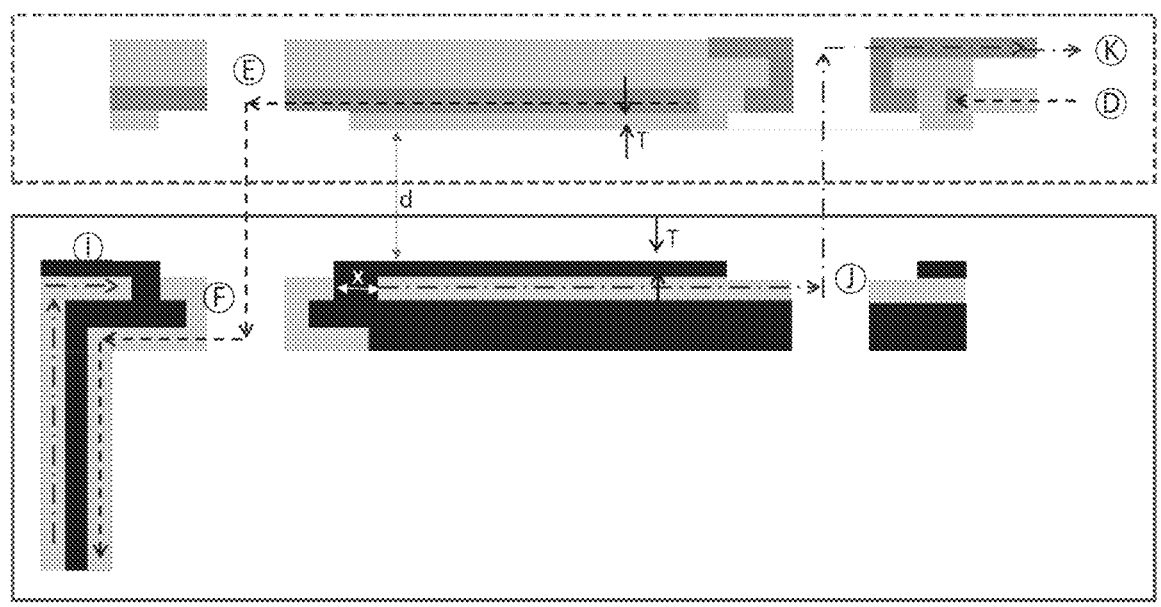
FIG. 18 is a schematic internal plan view of a power module in an exemplary embodiment of the present disclosure.

In the above power module, the insulation between the power module terminal and the external circuit also needs to be considered. Referring to FIG. 18, a partial structure of the laminated bus bars inside the power module is shown in the solid box, and a partial structure of the external circuit (such as the above-mentioned third bus bar, the fourth bus bar, etc.) is shown in the dashed box. The distance d between the partial structure of the laminated bus bar inside the power module and the partial structure of the external circuit is only for indicating that the two are separated in the figure. In actual use, the two structures will be closely fit together by mechanical compression or the like, to obtain better loop inductance.

Further, in order to ensure a good inductance control effect, a thickness T of the surface insulating layer located between the above two (for example, between the third bus bar and the rear portion of the second bus bar, or between the fourth bus bar and the rear portion of the fifth bus bar) is generally less than 0.5 mm. In the present exemplary embodiment, it is less than 0.2 mm preferably. At the same time, in order to ensure a good insulation effect, the surface insulation layer can be laminated by two insulation layers or even more insulation layers, thereby avoiding the failure of voltage isolation caused by cutthrough at the same position due to raw materials and process defects. The material of the surface insulating layer may be polyester, polyimide, epoxy resin, polyvinyl fluoride, silicone and not limited thereto. In addition, as for the insulating layer of the same material, the insulating distance X in the figure is greater than 0.2 mm, and preferably greater than 0.4 mm. In addition, the insulation treatment of the surface of the laminated bus bars and the insulation edge of the metal edge covering can also be performed. This section can refer to the prior art and will not be described again here.

In FIG. 18, the current direction may flow from the D position to the E position and then flow into the terminal F of the power module. After being distributed by the internal circuit of the power module, the current flows from the I position and flows to the terminal J of the module, and then flows to the external allocation unit K. In the above F position, it is necessary to realize the conversion of the bus bars of different layers, to lift the pin terminals to the same plane. In the case of a small current, the thickness of the laminated bus bars is usually relatively thin, and each pin terminal can be lifted to the same plane by through-hole plating. However, in the case of a large current, on the one hand, the thickness of the electroplating layer itself is limited and it is difficult to apply to a large current. On the other hand, the thickness of the laminated bus bar itself is also large, so it is difficult to use the through-hole plating manner to raise each pin terminal to the same plane. Based on this, a pin terminal (such as a T-type pin terminal, etc.) may be directly riveted to the lower layer of the laminated bus bars, so that all the pin terminals can reach the same plane. Of course, a metal gasket may also be directly provided on the lower layer of the laminated bus bars, to lift the pin terminals to the same plane. The metal gasket can be fixed on the lower layer of the laminated bus bars by the connecting material (such as conductive adhesive, welding material, etc.), or the metal gasket can be directly placed in the corresponding position when the system is assembled and then fixedly connected to the lower layer of the laminated bus bars through a stud installed by the system.

It should be noted that, in the above exemplary embodiments, the power module may further include typical components or structures, such as a chip, a potting glue, a housing and so on, all of which belong to a portion that can be configured by a person skilled in the art according to requirements, which is not specifically limited by the present exemplary embodiment.

Further, embodiments of the present disclosure also provide a power module assembly structure, wherein the power module assembly structure may include: a substrate; two power elements connected in serial disposed on the substrate; a first conductive strip and a second conductive strip. In the embodiment, the two power elements connected in series are disposed on the substrate. The first conductive strip and the second conductive strip are coupled to the two power elements respectively. In the embodiment, the first conductive strip and the second conductive strip extend from the substrate to a first side of the power module assembly structure in parallel and two connecting terminals are formed on the first side. An extending portion exists between the two connecting terminals, and the extending portion overlaps with an external conductive strip to reduce a parasitic inductance between the two connecting terminals.

As for the above power module assembly structure, within the power module, the first conductive strip and the second conductive strip are arranged in parallel to achieve counteraction of the current and reduce the parasitic inductance inside the power module. At the fan-out end of the power module, the counteraction of the current may also be achieved by overlapping an extending portion and an external conductive strip, which can reduce the parasitic inductance between the fan-out terminals of the power module. It should be noted that the first conductive strip may correspond to the above-mentioned first bus bar; the second conductive strip may correspond to the above-mentioned second bus bar; and the external conductive strip may correspond to the above-mentioned third bus bar, but the present disclosure does not limit it to this. Through the cooperation of the above two aspects, the parasitic inductance inside the power module can be greatly reduced, thereby easily and effectively reducing the voltage stress and power loss of the power electronic semiconductor element, and thereby improving the reliability and safety of the power electronic device.

Other embodiments of the present disclosure will readily occur to those skilled in the art upon consideration of the specification and practice of the disclosure disclosed herein. The present application is intended to cover any variations, uses, or adaptations of the present disclosure that follow general principles of the present disclosure and include common knowledge or conventional technical means in the art which are not disclosed herein. The specification and embodiments are considered as exemplary only, with the true scope and spirit of the present disclosure being indicated by the appending claims.

What is claimed is:

1. A component structure, for connecting a power module and an external circuit, wherein the component structure comprises:
a first bus bar, having one end extending to a first plane to form a first connecting terminal; a second bus bar, comprising a front portion of the second bus bar and a rear portion of the second bus bar, wherein the front portion of the second bus bar is laminated in parallel with the first bus bar, and the rear portion of the second bus bar is extended to a second plane to form a second connecting terminal; and the external circuit comprising a third bus bar, wherein the third bus bar is settled in parallel with the rear portion of the second bus bar, to reduce a parasitic inductance between the first connecting terminal and the second connecting terminal;
wherein a portion of the third bus bar disposed opposite to the rear portion of the second bus bar is a front portion of the third bus bar, and a surface of the rear portion of the second bus bar disposed opposite to the front portion of the third bus bar is a first surface, and an area ratio of an overlapping area of the rear portion of the second bus bar and the front portion of the third bus bar to the first surface is greater than 0.5.

2. The component structure according to claim 1, wherein the area ratio of the overlapping area of the rear portion of the second bus bar and the front portion of the third bus bar to the first surface is 1.

3. The component structure according to claim 1, wherein the first bus bar comprises a first extending portion and a first bending portion, and the first bending portion is located in the first plane; the front portion of the second bus bar comprises a second extending portion and a second bending portion, the rear portion of the second bus bar comprises a third extending portion and a third bending portion, the third bending portion is connected with the second bending portion, and the third extending portion is located in the second plane.

4. The component structure according to claim 1, wherein one end of the third bus bar is provided with a third connecting terminal, and the third connecting terminal is stacked and connected with the first connecting terminal;
the external circuit is further provided a fourth connecting terminal, and the fourth connecting terminal and the second connecting terminal are stacked and connected.

5. The component structure according to claim 4, wherein a current conducting direction of the first bus bar is opposite to that of the front portion of the second bus bar, and a current conducting direction of the rear portion of the second bus bar is opposite to that of the third bus bar.

6. The component structure according to claim 5, wherein at least one insulating material layer is disposed between the third bus bar and the rear portion of the second bus bar.

7. The component structure according to claim 1, wherein the first bus bar comprises a front portion of the first bus bar and a rear portion of the first bus bar, the rear portion of the first bus bar is extended to the first plane to form the first connecting terminal and an extending direction of the rear portion of the first bus bar is opposite to that of the rear portion of the second bus bar.

8. A power module, wherein the power module comprises: a substrate; a power unit, disposed on the substrate; and the component structure according to claim 1, the component structure connecting the power unit and the external circuit.

9. The power module according to claim 8, wherein the power unit at least comprises a first power element and a second power element connected in series, and a first end of the power unit is an end of the first power element, a second end of the power unit is an end of the second power element, and the first end of the power unit is connected to the first bus bar, and the second end of the power unit is connected to the second bus bar.

* * * * *